US012620884B2

(12) United States Patent
    Zeng

(10) Patent No.: US 12,620,884 B2
(45) Date of Patent: May 5, 2026

(54) CURRENT SAMPLING CIRCUIT

(71) Applicant: MetaPWR Electronics Co., Ltd.,
              Shanghai (CN)

(72) Inventor: Jianhong Zeng, Shanghai (CN)

(73) Assignee: MetaPWR Electronics Co., Ltd.,
              Shanghai (CN)

( * ) Notice: Subject to any disclaimer, the term of this
              patent is extended or adjusted under 35
              U.S.C. 154(b) by 143 days.

(21) Appl. No.: 18/433,420

(22) Filed: Feb. 6, 2024

(65) Prior Publication Data

US 2024/0275259 A1      Aug. 15, 2024

(30) Foreign Application Priority Data

Feb. 10, 2023    (CN) ......................... 202310104287.1

(51) Int. Cl.
    *G01R 19/32*        (2006.01)
    *G01R 19/00*        (2006.01)
    *H02M 1/00*         (2006.01)
(52) U.S. Cl.
    CPC ........ *H02M 1/0009* (2021.05); *G01R 19/003*
                (2013.01); *G01R 19/32* (2013.01)

(58) Field of Classification Search
    CPC .... H02M 1/0009; H02M 3/01; H02M 3/3353;
                G01R 19/003; G01R 19/32; G01R
                            19/0092; G01R 19/00
    See application file for complete search history.

(56)              References Cited

U.S. PATENT DOCUMENTS

2009/0097280 A1*    4/2009   Wu ................... H02M 3/33592
                                                            363/17
2011/0260651 A1*   10/2011   Fujimura ............... H05B 45/38
                                                            315/307
2020/0150154 A1*    5/2020   Chang ............... H02M 3/33592

* cited by examiner

*Primary Examiner* — Feba Pothen
(74) *Attorney, Agent, or Firm* — JCIPRNET

(57)              ABSTRACT

A current sampling circuit is provided. The current sampling
circuit includes a sampling unit provided with multiple
sampling input terminals, a sampling reference terminal and
at least one sampling output terminal. With a symmetric
winding arrangement and a phase-offset configuration of
control signals of the device, coupling voltage components
sent to the current sampling circuit is self-counteracted. An
amplification unit is further included in the current sampling
circuit. Output signals of the current sampling circuit are
calibrated by a calibration unit and compensated for tem-
perature influences by a temperature compensation unit.

17 Claims, 18 Drawing Sheets

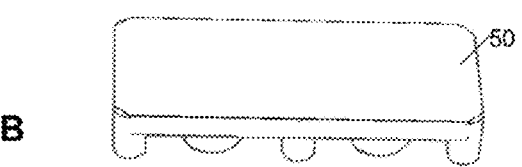
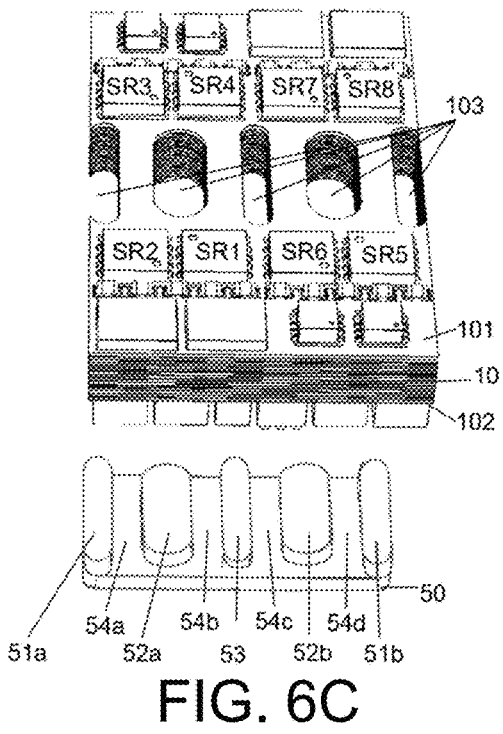
FIG. 6C
FIG. 6D

CURRENT SAMPLING CIRCUIT

CROSS-REFERENCE TO RELATED APPLICATION

This application claims the priority benefit of China application serial no. 202310104287.1 filed on Feb. 10, 2023. The entirety of the above-mentioned patent application is hereby incorporated by reference herein and made a part of this specification.

BACKGROUND

Technical Field

The invention relates to a field of power conversion, in particular to a current sampling circuit.

Description of Related Art

With the development of artificial intelligence, the power requirements of artificial intelligence data processing chips, such as CPUs, GPUs, TPUs and the like (collectively referred to as XPUs) are higher and higher, so that the power supply of the server is greatly increased, the power supply voltage of the system board rises from 12V to 48V. Two-stage voltage reduction circuits gradually become mainstream when the power supply voltage of the system board is 48V.

The intermediate conversion device in the two-stage voltage reduction circuit is a conversion device for the voltage conversion between the input bus and the output bus, and the ratio of the input voltage to the output voltage is either a fixed gain ratio or an unfixed gain ratio. Fixed gain ratio is usually 4:1, 8:1 or 12:1, etc. The intermediate conversion device with a fixed gain ratio is usually in an LLC circuit topology, and the LLC circuit topology provides zero-voltage turn-on (i.e., zero-voltage switching, ZVS) or zero-current turn-on (i.e., zero-current switching, ZCS) of the switch connected with the transformer according to the switching frequency, and shows beneficial effects of high switching frequency, high power conversion efficiency, and high power density.

With the output voltage of the intermediate conversion device lower and lower and the fixed gain ratio larger and larger, the number of low-voltage winding turns of the transformer in the LLC circuit topology is reduced from multiple turns to one turn or even reduced to 0.5 turn, and a tracking of the working current with a smaller time constant is needed for a steadier output of the device.

SUMMARY

In general, one aspect features a sampling circuit, comprising:

a sampling unit wherein the sampling unit is provided with at least two sampling input terminals, a sampling reference terminal and at least one sampling output terminal;

wherein the sampling circuit is electrically connected with a power conversion device for detecting a working current; the power conversion device is provided with a first voltage terminal and a second voltage terminal; the power conversion device comprises at least one switching circuit and at least one winding group; each winding group comprises two windings; the winding is provided with a first end and a second end; the second ends of the windings in one winding group are electrically connected with each other and with the first voltage terminal; the first ends of the windings in one winding group are electrically connected with at least one switching circuit; a voltage waveform is provided across each winding changing according to a working frequency in operation; in each winding group, the voltage waveforms corresponding to the two windings are in a phase offset of 180 degrees;

wherein the sampling reference terminal is electrically connected with the first voltage terminal, and the at least two sampling input terminals are respectively electrically connected with the first ends of the corresponding windings in the winding group or winding groups; and wherein the sampling unit is configured for sampling voltage waveforms across the windings, averaging by superposing the voltage waveforms to obtain a first output signal, and outputting the first output signal through at least one sampling output terminal; the first output signal is proportional to the working current of the power conversion device.

Implementations of the sampling circuit may include one or more of following features. M winding groups are provided in the power conversion device, and M is a positive integer; the voltage waveforms corresponding to one winding of each winding group are same in phase; output current components at nodes where the windings are electrically connected in the M winding groups are the same in phase; the working current of the power conversion device is equal to the superposition of the output current components at the nodes; and 2M sampling input terminals are provided.

Implementations of the sampling circuit may include one or more of following features. M winding groups are provided in the power conversion device, and M is a positive integer; the voltage waveforms corresponding to one winding of each winding group are in phase offsets of 360/(2M) degrees progressively in sequence; output current components of the windings are in phase offsets of 360/(2M) degrees progressively in sequence; and the working current is equal to the superposition of the output current components of the windings; 2M sampling input terminals are provided.

Implementations of the sampling circuit may include one or more of following features. The sampling circuit further comprises an amplification unit; wherein the amplification unit is provided with an amplification reference terminal, at least one amplification input terminal and an amplification output terminal; the amplification reference terminal is electrically connected with the second voltage terminal; the amplification input terminal is electrically connected with the sampling output terminal and configured for receiving the first output signal; the amplification unit is configured for amplifying the first output signal and outputting a second output signal, and the second output signal is proportional to the working current of the power conversion device.

Implementations of the sampling circuit may include one or more of following features. Proportional coefficient between the first output signal and the working current varies along with variation of the parasitic resistance of each winding.

Implementations of the sampling circuit may include one or more of following features. The sampling unit comprises at least two sampling resistors and a sampling capacitor, one end of each sampling resistor is electrically connected with one end of the sampling capacitor, another end of each sampling resistor is electrically connected to the corresponding sampling input terminal, and another end of the sampling capacitor is electrically connected to the sampling reference terminal.

Implementations of the sampling circuit may include one or more of following features. The amplification unit comprises an operational amplifier, an input terminal of the operational amplifier is electrically connected to the amplification input terminal, and an output terminal of the operational amplifier is electrically connected to the amplification output terminal.

Implementations of the sampling circuit may include one or more of following features. The sampling unit further comprises an impedance-matching resistor; the sampling capacitor is electrically connected to the sampling reference terminal through the impedance-matching resistor; the resistance of the impedance matching resistor is greater than or equal to the equivalent resistance of the sampling resistors in parallel.

Implementations of the sampling circuit may include one or more of following features. The first and second voltage terminals are output terminals of the power conversion device, and the working current is output current of the power conversion device.

Implementations of the sampling circuit may include one or more of following features. The first and second voltage terminals are input terminals of the power conversion device, and the working current is input current of the power conversion device.

Implementations of the sampling circuit may include one or more of following features. The power conversion device is provided with a calibration unit; the sampling circuit is electrically connected with the calibration unit; the calibration unit is configured for carrying out calibration processing and eliminating the influence on the amplitude distribution of output signals of the sampling circuit by the value distribution of the parasitic resistance of the windings.

Implementations of the sampling circuit may include one or more of following features. The power conversion device is provided with a temperature compensation unit; the sampling circuit is electrically connected with the temperature compensation unit; the temperature compensation unit is configured for compensating the influence of temperature on output signals of the sampling circuit.

Implementations of the sampling circuit may include one or more of following features. The parasitic resistance of the windings is equal to each other.

Implementations of the sampling circuit may include one or more of following features. M winding groups are provided in the power conversion device, and M is a positive integer; the M winding groups are respectively wound around different magnetically permeable cores, or the M winding groups are respectively wound around different core legs of a same magnetically permeable core, or the M winding groups are wound on a same core leg of a same magnetically permeable core.

Implementations of the sampling circuit may include one or more of following features. Each switching circuit comprises two switches; one ends of the two switches in each switching circuit are electrically connected with each other and with the second voltage terminal; the other ends of the two switches in each switching circuit are electrically connected with the first ends of the corresponding windings respectively; the duty ratio of control signals for the switches is 50%.

Implementations of the sampling circuit may include one or more of following features. The power conversion device is provided with at least one capacitor which is bridged between the first voltage terminal and the second voltage terminal; the terminal voltage across the first and second voltage terminals is a superposition of a direct-current voltage component and an alternating-current voltage component; frequency of the alternating-current voltage component varies within a range that is smaller than 2000 Hz.

Implementations of the sampling circuit may include one or more of following features. The frequency of the alternating-current voltage component varies within a range between 50 Hz and 60 Hz.

The details of one or more embodiments of the application are set forth in the accompanying drawings and description below. Other features, objects, and advantages of the application will be apparent from the description and drawings, and from the claims.

DESCRIPTION OF THE EMBODIMENTS

Figure 1A:
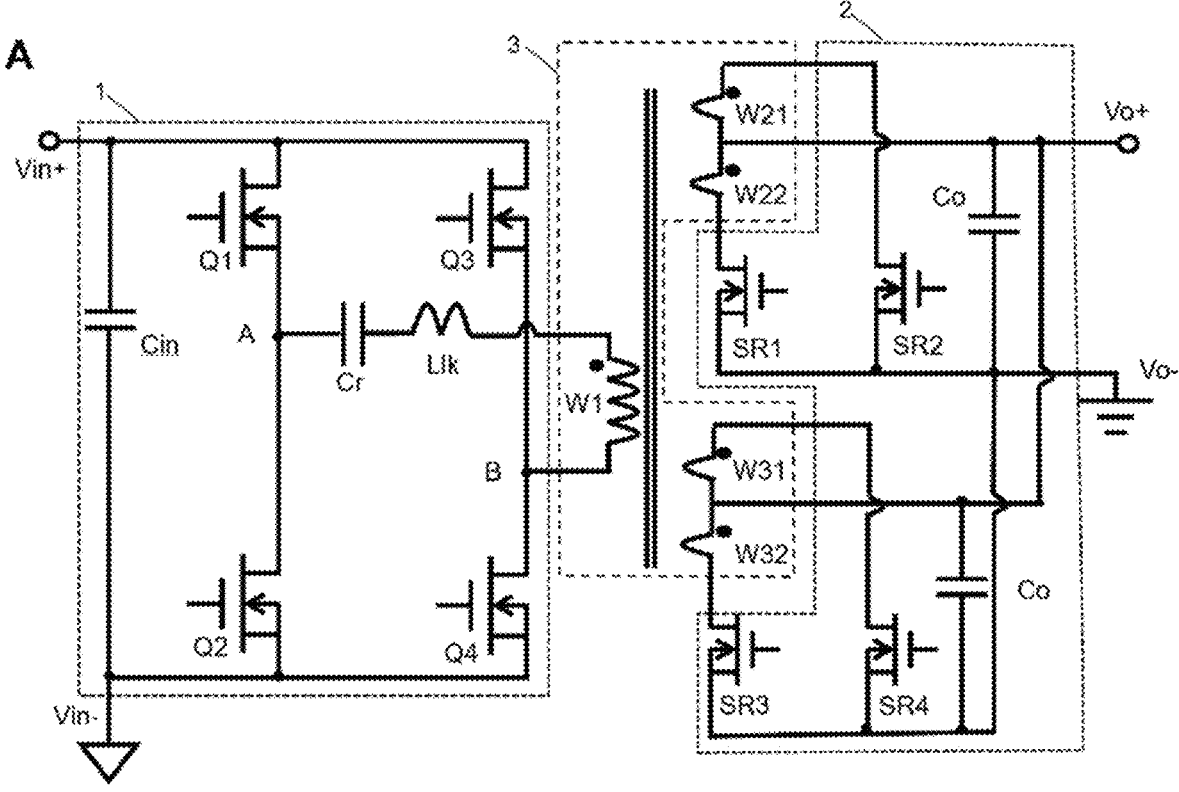
FIG. 1A to FIG. 3C are schematic diagrams of Embodiment 1.

The present application discloses various embodiments or examples of implementing the thematic technological schemes mentioned. To simplify the disclosure, specific instances of each element and arrangement are described below. However, these are merely examples and do not limit the scope of protection of this application. For instance, a first feature recorded subsequently in the specification formed above or on top of a second feature may include an embodiment where the first and second features are formed through direct contact, or it may include an embodiment where additional features are formed between the first and second features, allowing the first and second features not to be directly connected. Additionally, these disclosures may repeat reference numerals and/or letters in different examples. This repetition is for brevity and clarity and does not imply a relationship between the discussed embodiments and/or structures. Furthermore, when a first element is described as being connected or combined with a second element, this includes embodiments where the first and second elements are directly connected or combined with each other, as well as embodiments where one or more intervening elements are introduced to indirectly connect or combine the first and second elements.

Embodiment 1

Figure 1B:
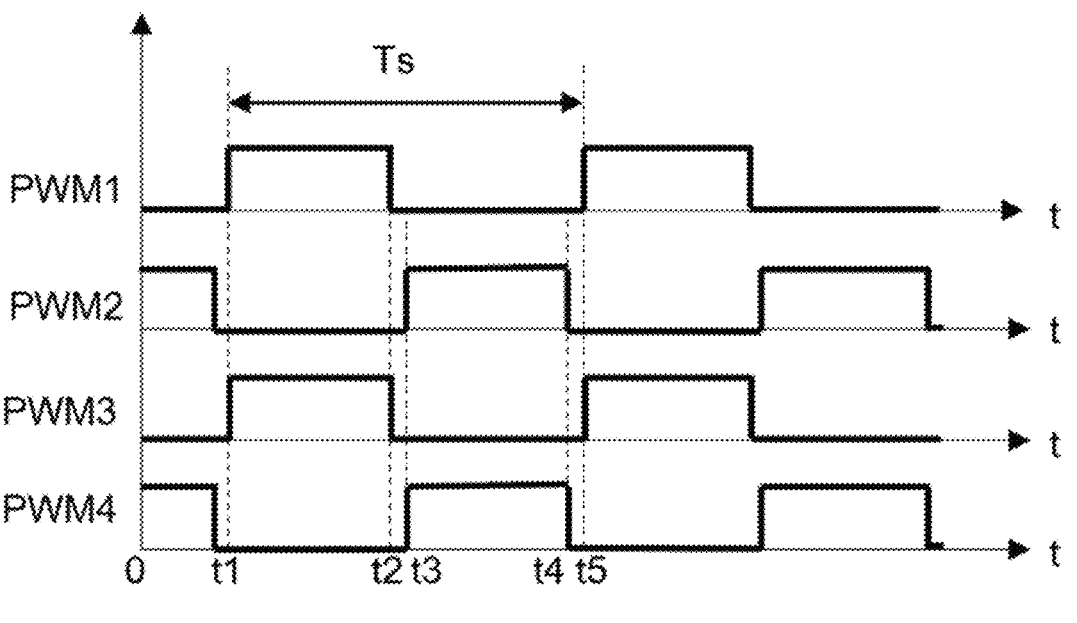
Figure 2A:
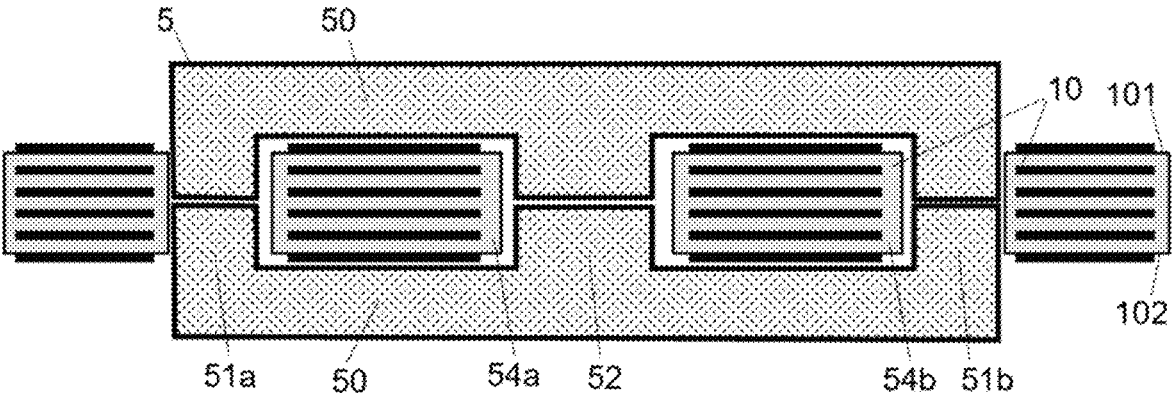
Figure 2B:
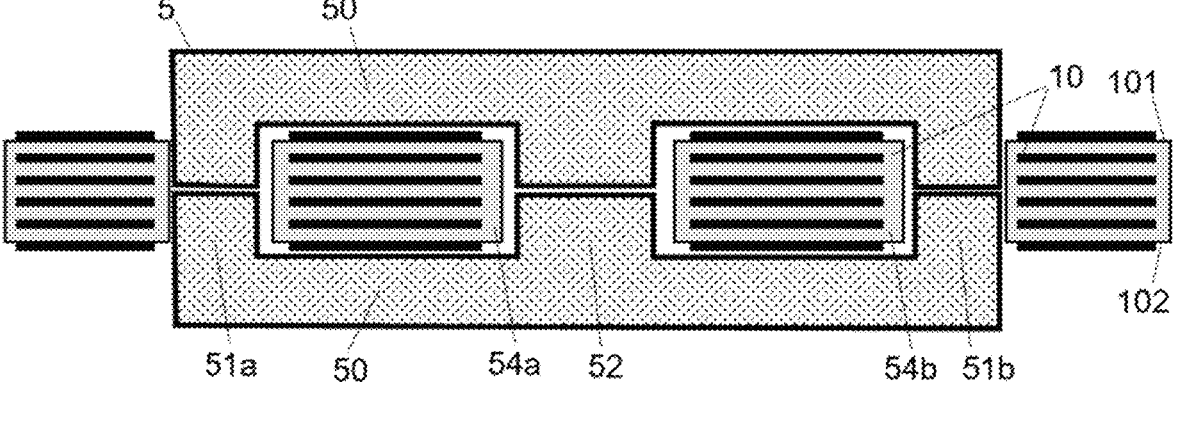
Figure 2C:
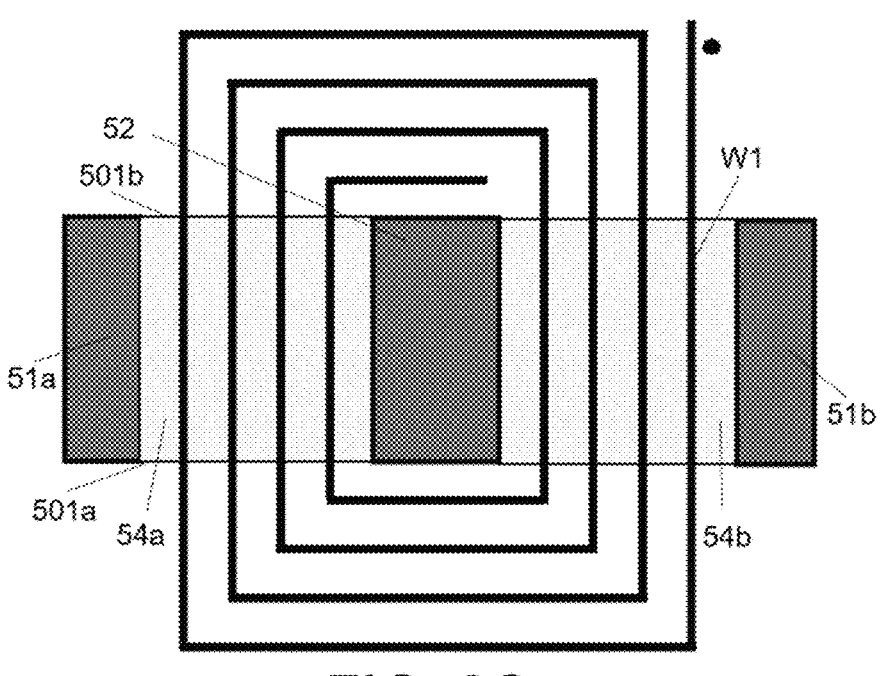
Figure 2D:
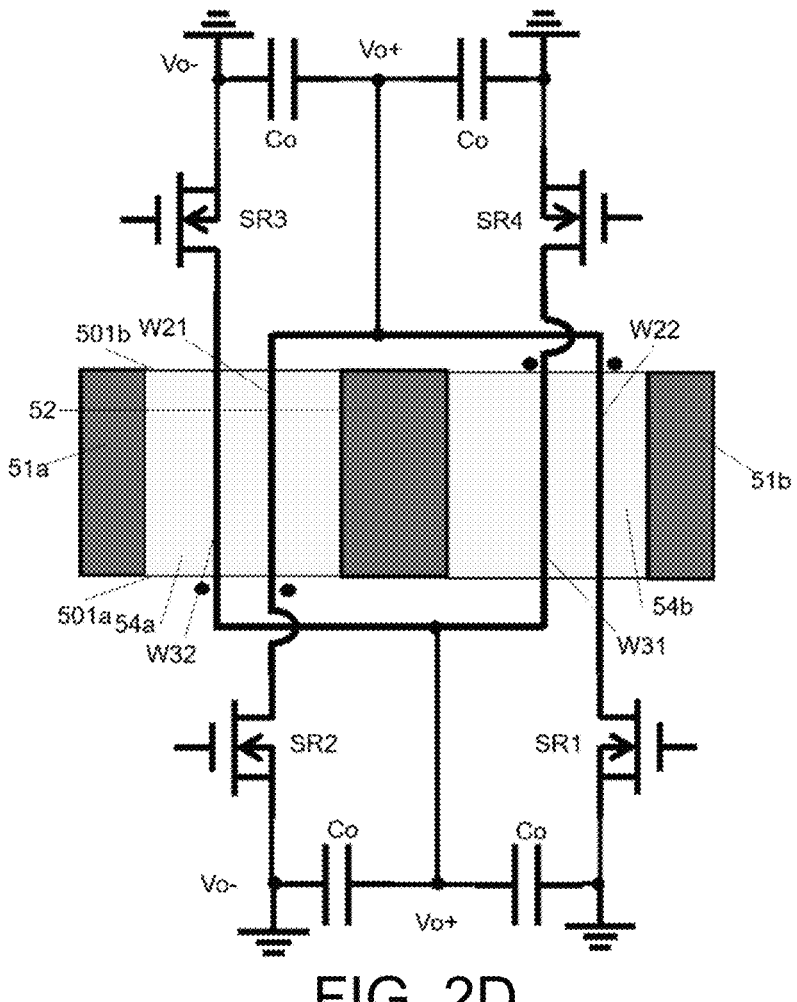
Figure 2E:
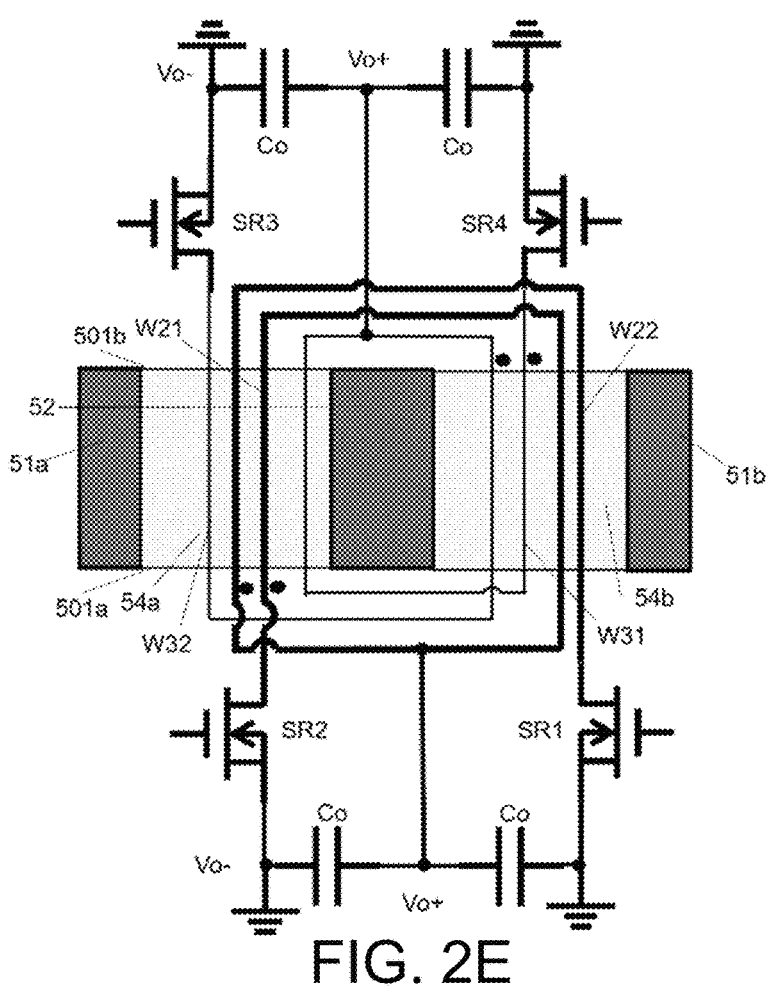
Figure 3A:
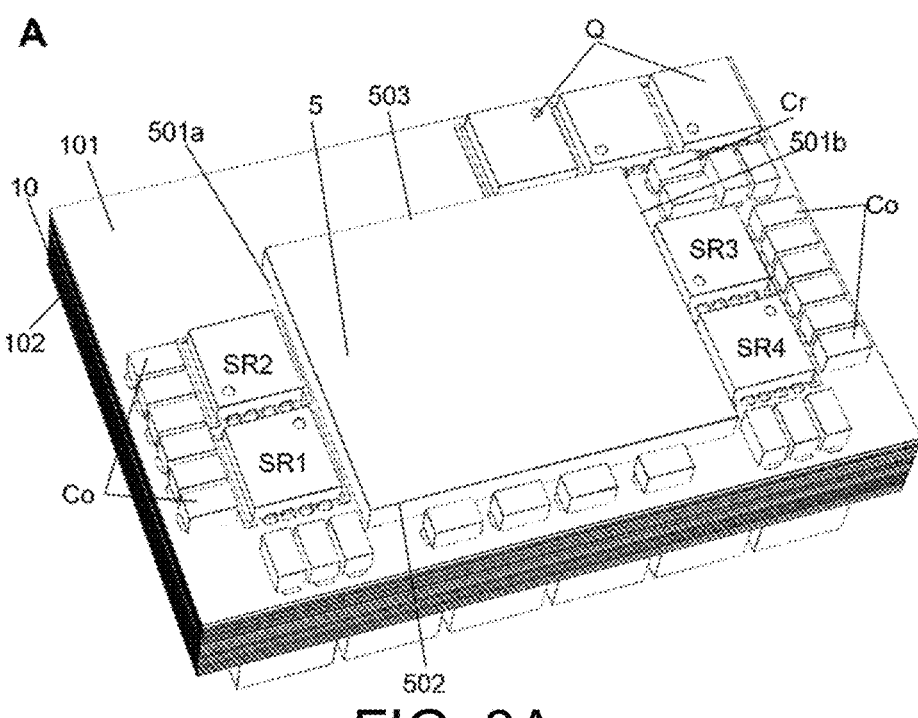
Figure 3B:
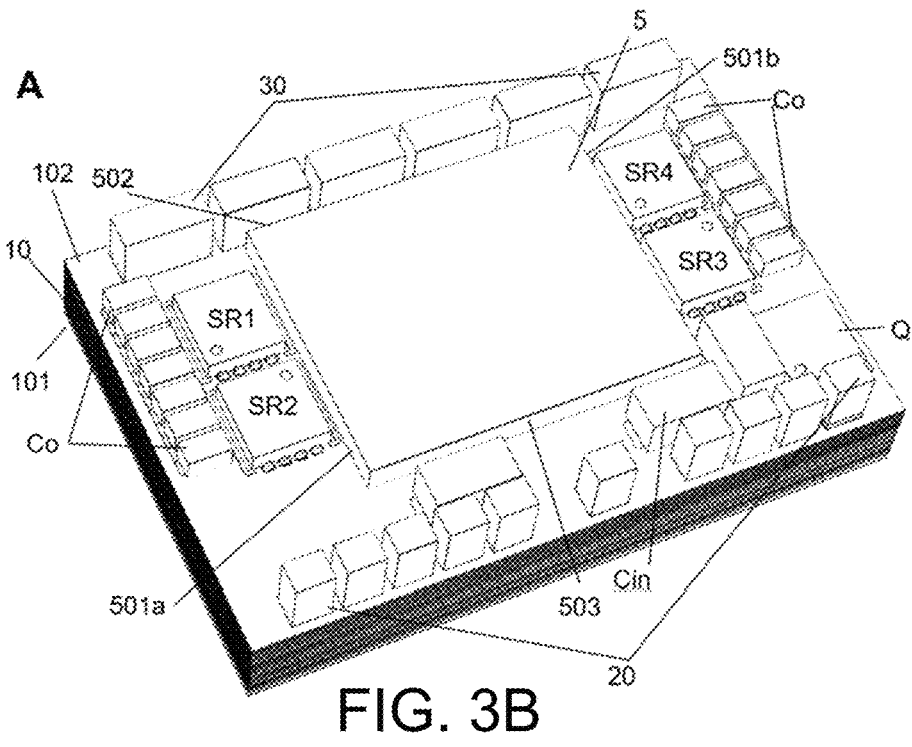
Figure 3C:
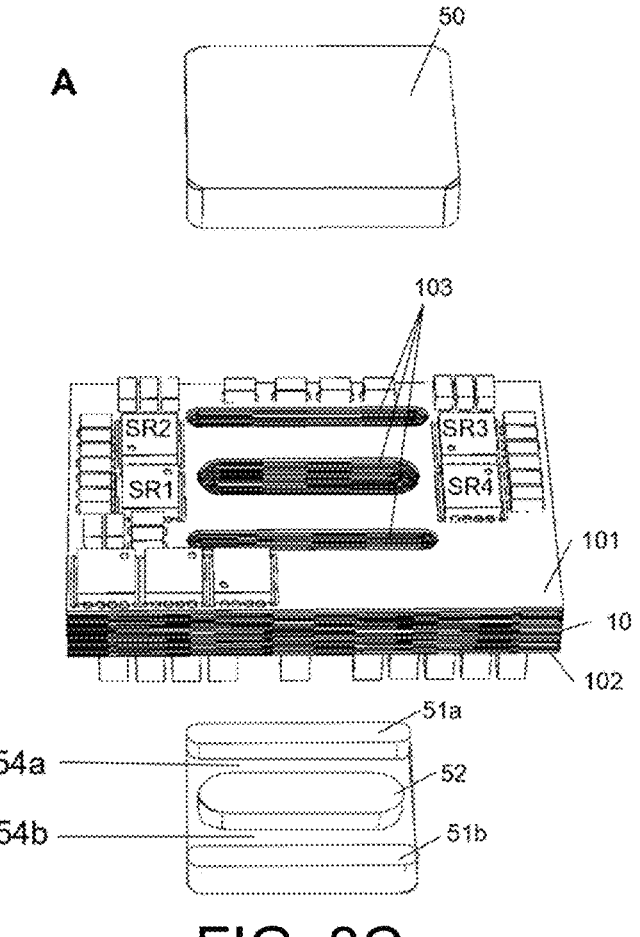

FIG. 1A shows a schematic diagram of a circuit topology corresponding to power modules A in some embodiments. FIG. 1B is a timing diagram of control signals required by the power modules A. FIGS. 2A-2B are vertical cross-sectional views of two different structures of magnetic apparatuses in the power modules A. FIGS. 2C-2E are winding arrangements in the power modules A, wherein FIG. 2C is an arrangement of a high-voltage winding, and FIGS. 2D-2E are two different arrangements of low-voltage windings. FIGS. 3A-3C are schematic structural diagrams of a power module A in some embodiment, wherein FIG. 3A is a three-dimensional top view (Top) of the power module A, FIG. 3B is a three-dimensional bottom view (Bottom) of the power module A, and FIG. 3C is a top-view explosion diagram (Top) of the power module A.

As shown in FIG. 1A and FIG. 1B, the circuit topology corresponding to the power modules A comprises a high-voltage circuit 1, a low-voltage circuit 2 and an intermediate conversion circuit of a magnetic apparatus 3, wherein the high-voltage circuit 1 comprises an input positive terminal Vin+, an input negative terminal Vin−, at least one input capacitor Cin, two bridge arms of switches (i.e., high-voltage switches), a resonant capacitor Cr and an equivalent resonant inductor Llk. One bridge arm comprises an upper switch Q1 and a lower switch Q2, the switches Q1 and Q2 are electrically connected in series; and the other bridge arm comprises an upper switch Q3 and a lower switch Q4, and the switches Q3 and Q4 are electrically connected in series. The switches may be Si MOSFETs, GaN MOSFETs, SiC MOSFETs or IGBTs, etc. In the following disclosure, the switches are described as Si MOSFETs for example. Source of the switch Q1 is electrically connected with drain of the switch Q2 at the middle node A1 of one bridge arm; source of the switch Q3 is electrically connected with drain of the switch Q4 at the middle node B1 of the other bridge arm; and the two bridge arms are electrically connected in parallel and with the input capacitor Cin also in parallel between the input positive terminal Vin+ and the input negative terminal Vin−. The magnetic apparatus 3 is a transformer in some embodiments, and comprises a high-voltage winding W1, four low-voltage windings and a magnetically permeable core 5, wherein the high-voltage winding W1 and the four low-voltage windings are coupled to the same magnetically permeable core 5 (as shown in FIGS. 2A-2E); the resonant capacitor Cr, the equivalent resonant inductor Llk and the high-voltage winding W1 are electrically connected in series to form an LLC branch, one end of the LLC branch is electrically connected with the middle node A1 of the bridge arm, and the other end of the LLC branch is electrically connected with the middle node B1 of the bridge arm. A first end of the high-voltage winding W1 is electrically connected with the equivalent resonant inductor Llk, and a second end of the high-voltage winding W1 is electrically connected with the middle node B1 of the bridge arm; the four low-voltage windings are respectively low-voltage winding W21, low-voltage winding W22, low-voltage winding W31 and low-voltage winding W32; the low voltage windings W21 and W22 are referred to as a first winding group, wherein a second end of the low-voltage winding W21 is electrically connected with a second end of the low-voltage winding W22; and the low-voltage windings W31 and W32 are referred to as a second winding group, wherein a second end of the low-voltage winding W31 is electrically connected with a second end of the low-voltage winding W32. The low-voltage circuit 2 comprises output positive terminals Vo+, output negative terminals Vo−, two switching circuits and at least one output capacitor Co; the output capacitor Co is electrically connected between the output positive terminal Vo+ and the output negative terminal Vo−; the two switching circuits are respectively a first switching circuit and a second switching circuit. The first switching circuit comprises two synchronous rectification switches SR1 and SR2 (i.e., low-voltage switches); sources of the switches SR1 and SR2 are short-circuited and electrically connected to the output negative terminal Vo− (i.e., negative voltage terminal of the output capacitor Co); drain of the switch SR1 is electrically connected with a first end of the low-voltage winding W22; drain of the switch SR2 is electrically connected with a first end of the low-voltage winding W21; and the second ends of the low-voltage windings W22 and W21 are electrically connected to the output positive terminal Vo+. The second switching circuit comprises two synchronous rectification switches SR3 and SR4; sources of the switches SR3 and SR4 are short-circuited and electrically connected to the output negative terminal Vo−; drain of the switch SR3 is electrically connected with a first end of the low-voltage winding W32; drain of the switch SR4 is electrically connected with a first end of the low-voltage winding W31; and the second ends of the low-voltage windings W32 and W31 are electrically connected to the output positive terminal Vo+. The high-voltage winding W1 and the four low-voltage windings W21/W22/W31/W32 are magnetically coupled with the magnetically permeable core 5 in a winding direction that the first end of the high-voltage winding W1, the first end of the low-voltage winding W21, the second end of the low-voltage winding W22, the first end of the low-voltage winding W31 and the second end of the low-voltage winding W32 have the same polarity and are marked as dotted ends, and meanwhile, the second end of the high-voltage winding W1, the second end of the low-voltage winding W21, the first end of the low-voltage winding W22, the second end of the low-voltage winding W31 and the first end of the low-voltage winding W32 have the same polarity and are marked as non-dotted ends. In some embodiments, the input negative terminal Vin− and the output negative terminal Vo− are not short-circuited for the electrical isolation between input and output. In some other embodiments where input and output are not isolated, the input negative terminal Vin− and the output negative terminal Vo− are short-circuited. In some embodiments, a bridge arm of capacitors is configured to substitute for one of the bridge arm of switches, comprising at least two capacitors which are electrically connected in series; other parts of the circuit are in accordance with those shown in FIG. 1A, and details are not described again.

The circuit topology disclosed in FIG. 1A is a full-bridge LLC circuit topology, and FIG. 1B is a timing diagram of control signals in the full-bridge LLC circuit topology, wherein the period from time point t1 to time point t5 indicated by the dotted line is a switching period Ts; control signals PWM1-4 are in a same frequency and the duty ratios are less than and close to 50%, wherein the control signal PWM1 (referred to as a first control signal) and the control signal PWM2 (referred to as a second control signal) are in a phase offset of 180° (half wave), the control signal PWM4 is an inverted signal of the control signal PWM1, and the control signal PWM3 is an inverted signal of the control signal PWM2 (with insertions of dead time). With the dead time t2-t3 and t4-t5 ignored, the duty ratios of the control signals PWM1-4 are all considered to be 50%. The control signal PWM1 is configured for controlling the switches Q1 and Q4; the control signal PWM2 is configured for controlling the switches Q2 and Q3; the control signal PWM3 is configured for controlling the switches SR1 and SR3; and the control signal PWM4 is configured for controlling the switches SR2 and SR4. The dead time between the control signals PWM4 and PWM1 and the dead time between the control signal PWM3 and the control signal PWM2 are configured for preventing the low-voltage windings from being short-circuited; according to the timing diagram as shown in FIG. 1B, the resonant capacitor Cr and the equivalent resonant inductor Llk resonates with the periodically switching of the eight switches, and the current through the resonant capacitor Cr is approximately in an sinusoidal waveform; when the amplitude of the resonant current through the equivalent resonant inductor Llk decreases and becomes close to the magnetizing current through the high-voltage winding W1, the control signal PWM1 or the control signal PWM2 is switched from a high level to a low level for a low-current turn-off of the switches Q1-Q4; the configuration of the dead time between the control signals PWM1 and PWM2, that is, the configuration of the intervals before the time points when the control signal PWM1 or the control signal PWM2 is switched from a low level to a high level, provides a ZVS turn-on of the switches Q1-Q4 resulting from the magnetizing current through the high-voltage winding W1; correspondingly, the control signal PWM3 or the control signal PWM4 is switched from a high level to a low level, and a ZCS turn-off of the switches SR1-SR4 is achieved. In some embodiments, a parasitic leakage inductance of the transformer is configured as the equivalent resonant inductor Llk; in some other embodiments an additional inductor or a combination of an additional inductor and a parasitic leakage inductance is provided and configured as the equivalent resonant inductor Llk; and the lower the equivalent resonant inductance is, the less the electric energy is remained in the equivalent resonant inductor Llk at the low-current turn-off of the switches Q1-Q4, thus the less the power loss is.

The structure of the magnetic apparatus 3 of the power module A and the winding arrangement of the high-voltage winding and the low-voltage windings are shown in FIGS. 2A-2E. In some embodiments, the magnetically permeable core 5 comprises two E-shaped core sections, as shown in a side view in FIG. 2A, the power module A comprises a winding substrate 10, the winding substrate 10 is provided with a first surface 101 and a second surface 102 opposite to each other, and further comprises the high-voltage winding and the low-voltage windings. As shown in FIG. 3C, the winding substrate 10 is provided with a plurality of magnetically-permeable-core holes 103, the magnetically-permeable-core holes 103 are in one-to-one correspondence with core legs of the magnetically permeable core 5 and penetrate from the first surface 101 to the second surface 102, with core legs of the magnetically permeable core 5 passing through. The core sections cover the winding substrate 10 respectively from the first surface 101 and the second surface 102 and the magnetically permeable core 5 is coupled with the high-voltage winding and the low-voltage windings arranged in the winding substrate 10 to form the magnetic apparatus 3.

In terms of function, the magnetically permeable core 5 comprises two core plates 50, a winding core leg 52 and two non-winding core legs. The non-winding core legs comprise a first side core leg 51a and a second side core leg 51b, the core legs are located between the two core plates 50, wherein the winding core leg 52 is arranged between the two side core legs 51a/b, and the first side core leg 51a, the winding core leg 52 and the second side core leg 51b are sequentially arranged in the same direction; and the magnetically permeable core 5 is buckled with the winding substrate 10 from the first surface 101 and the second surface 102 of the winding substrate 10 and is coupled with the windings arranged in the winding substrate 10. The channel between the first side core leg 51a and the winding core leg 52 is a first winding channel 54a, the channel between the second side core leg 51b and the winding core leg 52 is a second winding channel 54b, and the first and second winding channels 54a/b are channels for the arrangement of the windings in the magnetic apparatus 3; and referring to FIG. 3A, after the magnetically permeable core 5 and the winding substrate 10 are assembled, the four side surfaces of the core plates 50 arranged on the first and second surfaces 101/102 respectively correspond to a first winding channel side 501a, a second winding channel side 501b, an output side 502 and an input side 503 of the magnetically permeable core 5, wherein the first and second winding channel sides 501a/b are opposite to each other, and the output side 502 and the input side 503 are opposite to each other. In some other embodiments, the magnetically permeable core 5 comprises an E-shaped core section and an I-shaped core section; and in some other embodiments as shown in FIG. 2B, the magnetically permeable core 5 comprises core legs and core plates which are all individual core sections. The structure of individual core sections shows a beneficial effect that when the three core legs are respectively disposed through the magnetically-permeable-core holes 103 in the winding substrate 10, only the tolerance of the sizes of the core legs needs to be considered, and the tolerance of the distances between the core legs does not need to be considered. Due to the fact that the sizes of the core legs are far smaller than the distances between the core legs, the errors of the sizes of the core leg are far smaller than the errors of the distances between the core legs, so that the designed sizes of the magnetically-permeable-core holes 103 may be greatly reduced, thus the sizes of the winding channels are widened, the widths of the windings arranged in the winding substrate 10 are widened, and the parasitic resistance of the windings is reduced. The structure is particularly suitable for a magnetically permeable core structure with a plurality of core legs arranged in a row in that the more the core legs are provided, the longer the core plates are, the larger the errors of distances between the core legs are. The core legs are sectioned from the interface of the core plates and are individually formed, the errors of sizes of the magnetically permeable core in mass production may be remarkably reduced. Therefore, the sizes of the magnetically-permeable-core holes 103 in the winding substrate 10 are greatly reduced. The core plates and the core legs aforementioned are in square shapes, and they are not limited thereto. According to the specifications of practical implementations, the core plates or the core legs may be circular, oval or polygonal and the like.

FIG. 2C is a perspective top-view diagram of the arrangement of the high-voltage winding W1 around the magnetically permeable core 5. The high-voltage winding W1 starts from the dotted end (i.e., the first end) shown in FIG. 2C, passes through the second winding channel 54b in a first direction (i.e., from top to bottom), passes through the first winding channel 54a in a second direction (i.e., from bottom to top) and is wound clockwise around the winding core leg 52. Multi-turn winding is arranged on a same wiring layer of the winding substrate 10; and the winding arrangement of the high-voltage winding W1 is not limited thereto. As long as the high-voltage winding W1 passes alternately through the two winding channels and alternately in the first and second directions and is wound horizontally around the winding core leg 52 in a same direction, the multi-turn winding is not limited to being arranged within one wiring layer. In some embodiments, the high-voltage winding W1 is arranged on more than one wiring layer, and layer-to-layer electrical connections are formed through vias.

FIG. 2D is a schematic diagram of the arrangement of the low-voltage windings W21/W22/W31/W32 and the low-voltage circuit 2 around the magnetically permeable core 5.

Sources of the switches SR1/SR2 are electrically connected to output negative terminals Vo−; drain of the switch SR2 is electrically connected to the dotted end (i.e., the first end) of the low-voltage winding W21; the low-voltage winding W21 passes through the first winding channel 54a from the dotted end in the second direction, and the non-dotted end (i.e., the second end) of the low-voltage winding W21 is electrically connected to an output positive terminal Vo+; drain of the switch SR1 is electrically connected to the non-dotted end (i.e., the first end) of the low-voltage winding W22; the low-voltage winding W22 passes through the second winding channel 54b from the non-dotted end in the second direction, and the dotted end (i.e., the second end) of the low-voltage winding W22 is electrically connected to the output positive terminal Vo+. The first ends of the low-voltage windings W21/W22 are arranged on the first winding channel side 501a; the second ends of the low-voltage windings W21/W22 are arranged on the second winding channel side 501b; the first winding group (i.e., the low-voltage winding W21 and the low-voltage winding W22) is wound clockwise from the dotted end of the low-voltage winding W21 to the non-dotted end of the low-voltage winding W22 around the winding core leg 52 for one turn in total, that is, the low-voltage winding W21 is wound around the winding core leg 52 for 0.5 turn, the low-voltage winding W22 is wound around the winding core leg 52 for another 0.5 turn, and the first winding group is located on a same wiring layer of the winding substrate 10. The low-voltage winding W21 and the low-voltage winding W22 may also be formed on different wiring layers of the winding substrate 10, and short-circuited through a via which is also electrically connected to the output positive terminal Vo+. Similarly, sources of the switches SR3/SR4 are electrically connected to output negative terminals Vo−; drain of the switch SR4 is electrically connected to the dotted end (i.e., the first end) of the low-voltage winding W31; the low-voltage winding W31 passes through the second winding channel 54b from the dotted end in the first direction, and the non-dotted end (i.e., the second end) of the low-voltage winding W31 is electrically connected to an output positive terminal Vo+; drain of the switch SR3 is electrically connected to a non-dotted end (i.e., the first end) of the low-voltage winding W32, the low-voltage winding W32 passes through the first winding channel 54a from the non-dotted end in the first direction, and the dotted end (i.e., the second end) of the low-voltage winding W32 is electrically connected to the output positive terminal Vo+. The first ends of the low-voltage windings W31/W32 are arranged on the second winding channel side 501b; the second ends of the low-voltage windings W31/W32 are arranged on the first winding channel side 501a, the second winding group (i.e., the low-voltage winding W31 and the low-voltage winding W32) is wound clockwise around the winding core leg 52 from the dotted end of the low-voltage winding W31 to the non-dotted end of the low-voltage winding W32 for one turn in total, that is, the low-voltage winding W31 is wound around the winding core leg 52 for 0.5 turn, the low-voltage winding W32 is wound around the winding core leg 52 for another 0.5 turn, and the second winding group is located on a same wiring layer of the winding substrate 10. The low-voltage winding W31 and the low-voltage winding W32 may also be formed on different wiring layers of the winding substrate 10 and short-circuited through a via which is also electrically connected to the output positive terminal Vo+. At least two output capacitors Co are respectively arranged on two opposite sides of the magnetically permeable core 5, that is, on the first winding channel side 501a and on the second winding channel side 501b, and are bridged between the output positive terminal Vo+ and the output negative terminal Vo− of each side. The output positive terminals Vo+ on the two opposite sides of the magnetically permeable core 5 are short-circuited, and the output negative terminals Vo− on the two opposite sides of the magnetically permeable core 5 are short-circuited. According to the 0.5-turn structure and the winding arrangement of the low-voltage windings and the layout of the corresponding low-voltage circuit 2 disclosed in the aforementioned embodiments, the path of the low-voltage windings are short, the impedance is low, the power loss on the low-voltage windings is reduced, and the first and second switching circuits are arranged on the two opposite sides of the magnetically permeable core 5 respectively. Compared with the structure that the first and second switching circuits are arranged on a same side of the magnetically permeable core 5, the first ends and the second ends of each low-voltage winding group are arranged on the two opposite winding channel sides, and the first and second switching circuits are also arranged on the two opposite winding channel sides and adjacent to terminals of the winding channels; thus the space on the two opposite sides of the magnetically permeable core 5 is more fully utilized, occupied area of the first and second switching circuits and number of the switches are greatly increased to be doubled, the parasitic resistance on the switching circuits is reduced, and the conduction loss of the power module A is reduced. Further, the low-voltage windings W21/W22 are arranged in different winding channels respectively; by comparing the current flowing through the low-voltage winding W21 with the current flowing through the low-voltage winding W22, it can be seen that amplitudes and directions of the direct-current current components are the same, and amplitudes of the alternating-current components are essentially the same with a phase shift of 180°. Similarly, by comparing the current flowing through the low-voltage winding W31 with the current flowing through the low-voltage winding W32, it can be seen that amplitudes and directions of the direct-current components are the same, and amplitudes of the alternating current components are essentially the same with a phase shift of 180°. The low-voltage winding W21 and the low-voltage winding W32 are arranged though the same winding channel, that is, the first winding channel 54a; by comparing the current flowing through the low-voltage winding W21 with the current flowing through the low-voltage winding W32, it can be seen that directions of the direct-current components are opposite with amplitudes approximately the same, and the amplitudes and phases of the alternating current components are the same. Similarly, the low-voltage winding W22 and the low-voltage winding W31 are arranged through the same winding channel, that is, the second winding channel 54b; by comparing the current flowing through the low-voltage winding W22 with the current flowing through the low-voltage winding W31, it can be seen that, directions of the direct-current components are opposite with amplitudes approximately the same, and the amplitudes and phases of the alternating current components are the same. Within either winding channel, by comparing sum of the currents flowing through the low-voltage windings with the current flowing through the high-voltage winding (multiplied by the number of turns), it can be seen that amplitudes of the direct-current components of the two are essentially 0, and amplitudes of the alternating-current components of the two are approximately the same with the current directions approximately opposite. The aforementioned winding arrangement shows beneficial effects that the two low-voltage windings and one high-voltage winding in either winding channel are provided with a minimized alternating-current resistance and a reduced conduction loss.

The winding arrangement of the low-voltage windings is not limited thereto. In some embodiments, another winding arrangement of the low-voltage windings is shown in FIG. 2E, different from that of the embodiment according to FIG. 2D. The low-voltage winding W21 passes through the first winding channel 54a in the second direction from the dotted end (i.e., the first end) and then passes through the second winding channel 54b in the first direction, and the non-dotted end (i.e., the second end) of the low-voltage winding W21 is electrically connected to an output positive terminal Vo+; the low-voltage winding W22 passes through the second winding channel 54b from the non-dotted end (i.e., the first end) in the second direction and then passes through the first winding channel 54a in the first direction, and the dotted end (i.e., the second end) of the low-voltage winding W22 is electrically connected to the output positive terminal Vo+. Therefore, the first and second ends of the low-voltage windings W21/W22 are arranged on the first winding channel side 501a; the first winding group (i.e., the low-voltage winding W21 and the low-voltage winding W22) is wound around the winding core leg 52 clockwise from the dotted end of the low-voltage winding W21 to the non-dotted end of the low-voltage winding W22 for two turns in total, that is, the low-voltage winding W21 is wound around the winding core leg 52 for one turn and the low-voltage winding W22 is wound around the winding core leg 52 for another one turn. Similarly, the low-voltage winding W31 passes through the second winding channel 54b from the dotted end (i.e., the first end) in the first direction and then passes through the first winding channel 54a in the second direction, and the non-dotted end (i.e., the second end) of the low-voltage winding W31 is electrically connected to an output positive terminal Vo+; the low-voltage winding W32 passes through the first winding channel 54a in the first direction from the non-dotted end (i.e., the first end) and then passes through the second winding channel 54b in the second direction, and the dotted end (i.e., the second end) of the low-voltage winding W32 is electrically connected to the output positive terminal Vo+. Therefore, the first and second ends of the low-voltage windings W31/W32 are arranged on the second winding channel side 501b; the second winding group (i.e., the low-voltage winding W31 and the low-voltage winding W32) is wound around the winding core leg 52 clockwise from the dotted end of the low-voltage winding W31 to the non-dotted end of the low-voltage winding W32 for two turns in total, that is, the low-voltage winding W31 is wound around the winding core leg 52 for one turn and the low-voltage winding W32 is wound around the winding core leg 52 for another one turn. The low-voltage windings arranged in 1-turn structure also shows the technical effects as in the 0.5-turn structure, with the first ends of the two windings in the first winding group and the first ends of the two windings in the second winding group arranged towards the opposite sides respectively and correspondingly the first and second switching circuits arranged towards the opposite sides respectively. Compared with the structure that the first switching circuit and the second switching circuit are arranged on the same side of the magnetically permeable core 5, the space on the two opposite sides is more fully utilized, so that the occupied area of the first and second switching circuits and the number of the switches are greatly increased to be doubled, the parasitic resistance on the switching circuits is reduced, and the conduction loss of the power module A is reduced.

FIGS. 3A-3C show a three-dimensional structure diagram of the power module A, wherein FIG. 3A is a top view, FIG. 3B is a bottom view, and FIG. 3C is a top-view explosion diagram. As shown in FIG. 3A, the power module A comprises a winding substrate 10, a magnetically permeable core 5, a plurality of high-voltage switches Q, a plurality of synchronous rectification switches SR1-SR4, at least one input capacitor Cin (i.e., high-voltage capacitor), and at least one output capacitor Co (i.e., low-voltage capacitor), input pins 20 and output pins 30. The switches SR1/SR2 in the first switching circuit arranged on a first surface 101 are both disposed on the first winding channel side 501a, and positions of sources of the switches SR1/SR2 are arranged close to each other and short-circuited to form a synchronous rectification source node of the first switching circuit; the switches SR3/SR4 in the second switching circuit are disposed on the second winding channel side 501b, and positions of sources of the switches SR3/SR4 are arranged close to each other and short-circuited to form a synchronous rectification source node of the second switching circuit. The switch SR3 and the switch SR2 are opposite in position, and the switch SR1 and the switch SR4 are opposite in position; and at least two output capacitors Co are symmetrically arranged respectively on the outer sides of the switches SR1-SR4. A plurality of high-voltage switches Q are disposed on the input side 503. As shown in FIG. 3C, in the winding substrate 10, the regions between two adjacent magnetically-permeable-core holes 103 respectively correspond to the first winding channel 54a and the second winding channel 54b after the magnetically permeable core 5 is assembled with the winding substrate 10; the low-voltage windings W21/W22 correspondingly pass through the first winding channel 54a or the second winding channel 54b; the first ends of the low-voltage windings W21/W22 are arranged on the first winding channel side 501a, and the second ends of the low-voltage windings W21/W22 are arranged on the second winding channel side 501b. The low-voltage windings W31/W32 correspondingly pass through the second winding channel 54b or the first winding channel 54a; the first ends of the low-voltage windings W31/W32 are arranged on the second winding channel side 501b, the second ends of the low-voltage windings W31/W32 are arranged on the first winding channel side 501a. on the first winding channel side 501a, the switch SR1 is placed close to the second winding channel 54b, with drain of the switch SR1 electrically connected to the first end of the low-voltage winding W22 in a shortest distance; the switch SR2 is placed close to the first winding channel 54a, with drain of the switch SR2 electrically connected to the first end of the low-voltage winding W21 in a shortest distance; the switch SR3 is placed close to the first winding channel 54a, with drain of the switch SR3 electrically connected to the first end of the low-voltage winding W31 in a shortest distance; and the switch SR4 is placed close to the second winding channel 54b, with drain of the switch SR4 electrically connected to the first end of the low-voltage winding W32 in a shortest distance.

In some embodiments, the first output capacitor Co, the first switching circuit, the magnetically permeable core 5, the second switching circuit and the second output capacitor Co are arranged along a device position line, the device position line is defined as a straight line penetrating through the two opposite sides of the winding substrate 10, the device position line penetrates through the at least one output capacitor, one synchronous rectification switch, the magnetically permeable core, another synchronous rectification switch and at least one another output capacitor. The output capacitors Co are symmetrically arranged on the outer sides of the synchronous rectification switches. On one hand, the drains of the switches SR1/SR2 are connected with the first ends of the low-voltage windings W22/W21 in the shortest distance; the sources of the switches SR1/SR2 are close to each other; the alternating-current loop formed by the switch SR1, the low-voltage winding W22, the low-voltage winding W21 and the switch SR2 is minimized; and the parasitic leakage inductance and the alternating-current resistance of the loop are greatly reduced. On the other hand, the drains of the switches SR3/SR4 are connected to the first ends of the low-voltage windings W31/W32 in the shortest distance; the sources of the switches SR3/SR4 are close to each other; the alternating-current loop formed by the switch SR3, the low-voltage winding W32, the low-voltage winding W31 and the switch SR4 is minimized; and the parasitic leakage inductance and the alternating-current resistance of the loop are greatly reduced.

Similarly, the switches SR1/SR2 in the first switching circuit arranged on the second surface 102 are both disposed on the first winding channel side 501a, and positions of sources of the switches SR1/SR2 are close to each other and short-circuited to form a synchronous rectification source node of the first switching circuit; the switches SR3/SR4 in the second switching circuit are arranged on the second winding channel side 501b, and positions of sources of the switches SR3/SR4 are close to each other and short-circuited to form a synchronous rectification source node of the second switching circuit. The switch SR3 and the switch SR2 are opposite in position, and the switch SR1 and the switch SR4 are opposite in position; the input pins 20 are arranged on the input side 503, the output pins 30 are arranged on the output side 502, the angle between the relative position vector from any one of the output pins 30 to another and the output side 502 is smaller than or equal to 45 degrees; at least two output capacitors Co are respectively and symmetrically arranged on the outer side of the switches SR1-SR4. In some embodiments, positions of the output capacitors Co and the switches SR1-SR4 arranged on the first surface 101 of the winding substrate 10 are in one-to-one correspondence with those on the second surface 102, that is, the position of the output capacitor Co arranged on the first surface 101 partially overlaps or wholly coincides with a projection position to the first surface 101 of the corresponding output capacitor Co arranged on the second surface 102, and the position of the synchronous rectification switch arranged on the first surface 101 partially overlaps or wholly coincides with a projection position to the first surface 101 of the corresponding synchronous rectification switch arranged on the second surface 102, so that device pins may be short-circuited by vertical vias through the winding substrate 10 just at the positions of bonding pads of the device pins as well as other kind of vias. In detail, on the first winding channel side 501a, positive device pin of the output capacitor Co located on the first surface 101 and positive device pin of the output capacitor Co located on the second surface 102 are short-circuited by the vertical via in the position of their bonding pads or other kind of vias through the winding substrate 10; and negative device pin of the output capacitor Co located on the first surface 101 and the negative device pin of the output capacitor Co located on the second surface 102 are also short-circuited by the vertical via in the position of their bonding pads or other kind of vias through the winding substrate 10. The sources of the switches SR1/SR2 located on the first surface 101 are respectively short-circuited with the sources of the switches SR1/SR2 located on the second surface 102 by the vertical vias in the position of their bonding pads or other kind of vias through the winding substrate 10; and the drains of the switches SR1/SR2 located on the first surface 101 are respectively short-circuited with the drains of the switches SR1/SR2 located on the second surface 102 by the vertical vias in the position of their bonding pads or other kinds of vias through the winding substrate 10. Arrangement of the output capacitors and the synchronous rectification switches on the second winding channel side 501b is consistent with the arrangement of the output capacitors and the synchronous rectification switches on the first winding channel side 501b.

According to the aforementioned arrangement, the synchronous rectification switches can be placed both on the first surface 101 and on the second surface 102 of the winding substrate 10, located on two opposite terminal sides of the winding channels of the magnetically permeable core 5, so that the number of the synchronous rectification switches is doubled and redoubled from two to eight. The increase of the number of synchronous rectification switches not only reduces the parasitic resistance, resulting in a decrease of the switching loss on the synchronous rectification switches, but also increases the number of connecting nodes between the switching circuits and the low-voltage windings from two to eight, resulting in a decrease of the conduction loss on the connecting nodes; thus the conversion efficiency of the power module A is greatly improved. Further, on the same surface of the winding substrate 10 and at the same side of the winding channels of the magnetically permeable core 5, the positions of the sources of the synchronous rectification switches in the same switching circuit are adjacent and short-circuited and are adjacent to the magnetically permeable core, and the output capacitors are placed adjacent to the outer side of the synchronous rectification switches, so that alternating current loop formed by the low-voltage windings and the corresponding switching circuit is minimized, and the conduction loss of the alternating current in the loop is minimized.

At least three output pins 30 are provided. In some embodiments, the three output pins 30 may be configured as two output positive terminals Vo+ and one output negative terminal Vo−, and are sequentially arranged in an array of an output positive terminal Vo+, an output negative terminal Vo− and an output positive terminal Vo+, and may also be two output negative terminals Vo− and one output positive terminal Vo+, and are sequentially arranged in an array of an output negative terminal Vo−, an output positive terminal Vo+ and an output negative terminal Vo−. In some embodiments, six output pins 30 are provided and configured alternately in a first electrical property and in a second electrical property, that is, in an array of three pairs of output positive and negative terminals Vo+ and Vo−; the six output pins are arranged along one side edge of the power module A in an array. A side surface of the magnetically permeable core 5 facing the output pins 30 is referred to as an output side 502; a side surface opposite to the output side 502 is referred to as an input side 503; and the first winding channel side 501a and the second winding channel side 501b are respectively located between the output side 502 and the input side 503. In such a layout of arrangement, on the first hand, the shortest distance from the second ends of the two low-voltage windings extending out of the first winding channel side 501a to the output pins may be provided approximately equal to the shortest distance from the second ends of the two low-voltage windings extending out of the second winding channel side 501b to the output pins, so that the impedance from the second end of the low-voltage windings in the first winding group to the output pins is approximately equal to the impedance from the second end of the low-voltage windings in the second winding group to the output pins. On the second hand, the shortest distance from the synchronous rectification source node of the first switching circuit to the output pins is approximately equal to the shortest distance from the synchronous rectification source node of the second switching circuit to the output pins, so that the impedance of the synchronous rectification source node of the first switching circuit to the output pins is approximately equal to the impedance of the synchronous rectification source node of the second switching circuit to the output pins. On the third hand, the sum of the shortest distance from the second ends of the two windings of the second winding group to the output pins plus the shortest distance from the synchronous rectification source node of the first switching circuit to the output pins is approximately equal to the sum corresponding to the first winding group and the second switching circuit. With any of the three aforementioned criteria met, current self-equalization is achieved between the first switching circuit and the second switching circuit.

The input pins 20 includes at least one input positive pin Vin+ and a plurality of signal pins, and the signal pins are disposed on two sides of the input positive pin Vin+. In some embodiments, referring to FIG. 3A and FIG. 3B, the input capacitors Cin are also disposed between the magnetically permeable core 5 and the input positive pin Vin+, and the high-voltage switches are disposed on the first surface 101 and the second surface 102 of the winding substrate 10 and near the corner of the second channel side 501b and the input side 503; both ends of the high-voltage winding W1 are arranged on the second winding channel side 501b; one end of the high-voltage winding W1 is electrically connected to the middle node of one bridge arm of the high-voltage circuit 1, and the other end of the high-voltage winding W1 is electrically connected with the resonant capacitor Cr arranged on the first surface 101, the resonant capacitor Cr then electrically connected to the middle node of the other bridge arm.

As shown in FIG. 3C, the configuration of air gaps which section the three core legs and the resulting reluctance of the magnetically permeable core are as follows: in some embodiments, heights of the air gaps at the first side core leg 51a and the second side core leg 51b are configured to be approximately equal and relatively small or close to 0, resulting in low-reluctance legs; heights of the air gap at the winding core leg 52 is larger than that at the first and second side core legs 51a/b, resulting in a high-reluctance leg, so that sufficient magnetization current is generated in the high-voltage winding W1 for ZVS turn-on in the high-voltage circuit 1. In some other embodiments, the air gaps at the first side core leg 51a, at the second side core leg 51b and at the winding core leg 52 are the same in height; the configuration of the same heights of the air gaps at the three core legs shows beneficial effects that on one hand, no further processing step on the winding core leg 52 for setting the height of the air gap is required, the magnetically permeable core easy to form and assemble, and on the other hand, on meeting the requirements that a sufficient magnetization current is generated in the high-voltage winding W1 for ZVS turn-on in the high-voltage circuit 1, the air gap at the winding core leg 52 is reduced, and the air gaps of the first and second side core legs 51a/b are increased, so that the total amount of eddy current loss generated on the windings by the magnetic flux leakage from the air gaps at the three core legs is reduced, the light-load power loss of the power module A is reduced, and the heavy-load conversion efficiency of the power module A is improved.

Embodiment 2

Figure 4A:
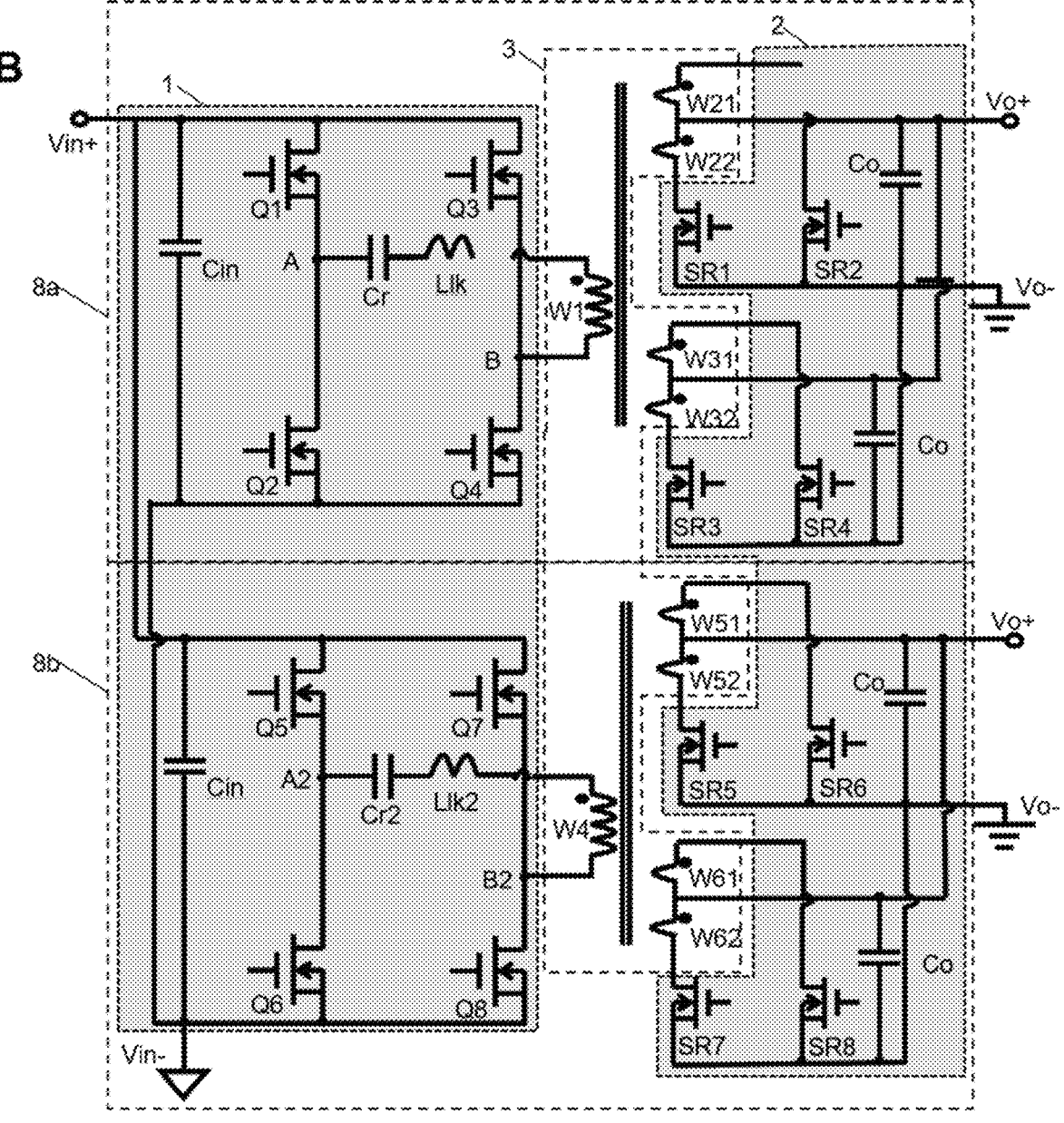
FIG. 4A to FIG. 6D are schematic diagrams of Embodiment 2.
Figure 4B:
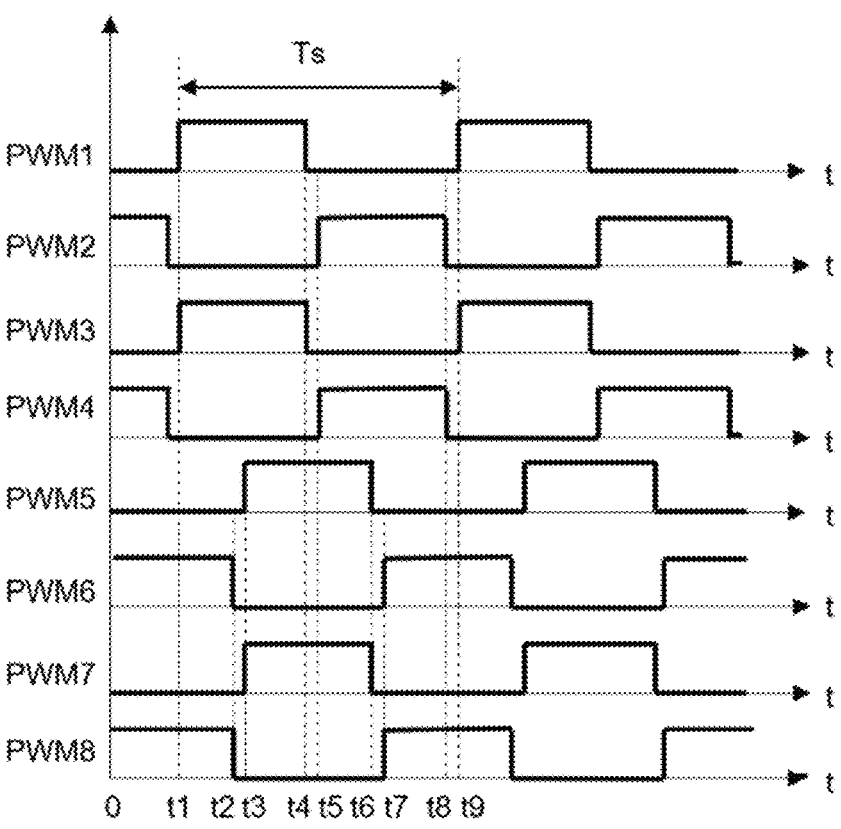
Figure 5A:
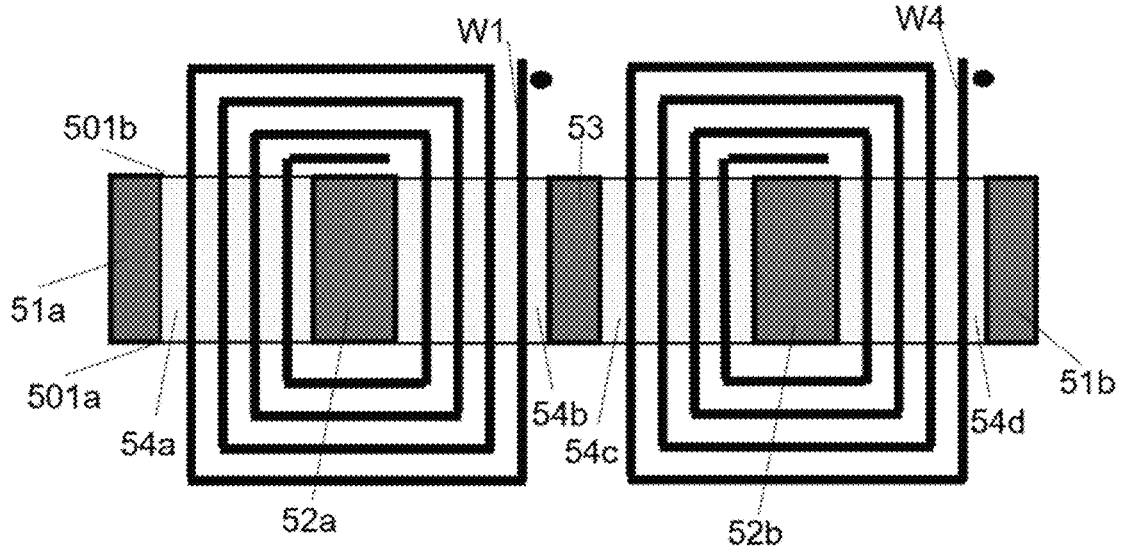
Figure 5B:
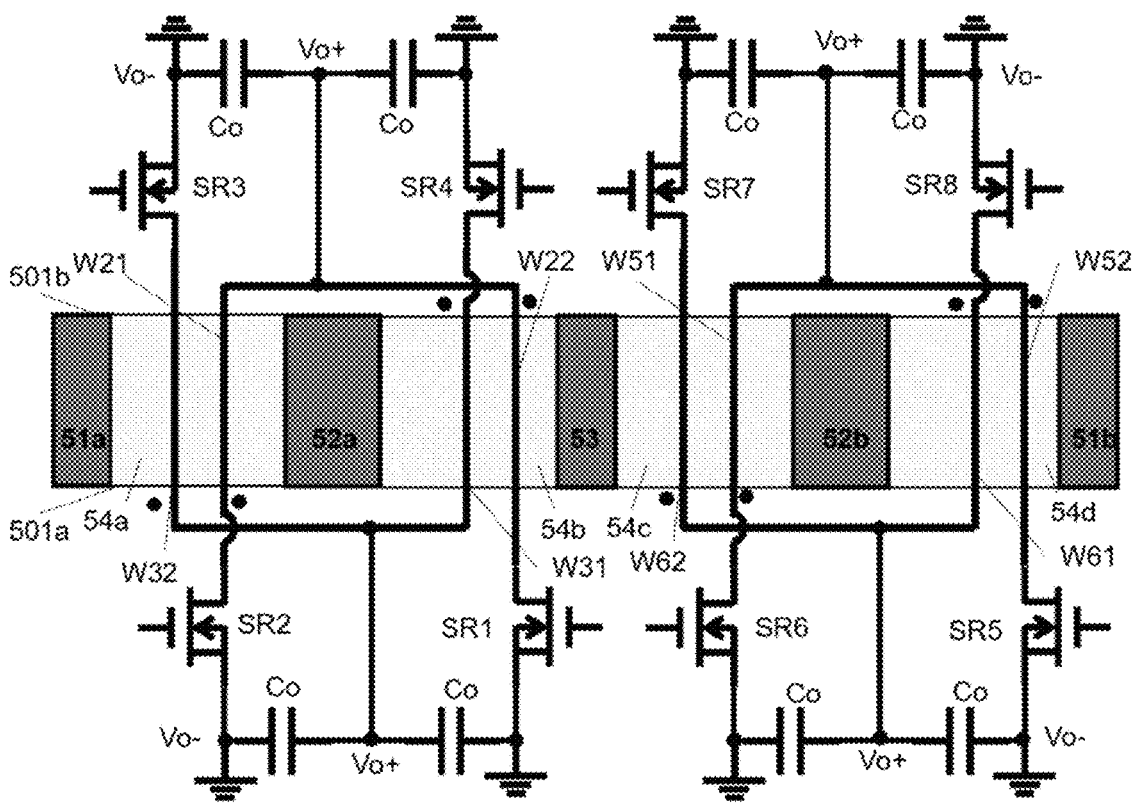
Figure 5C:
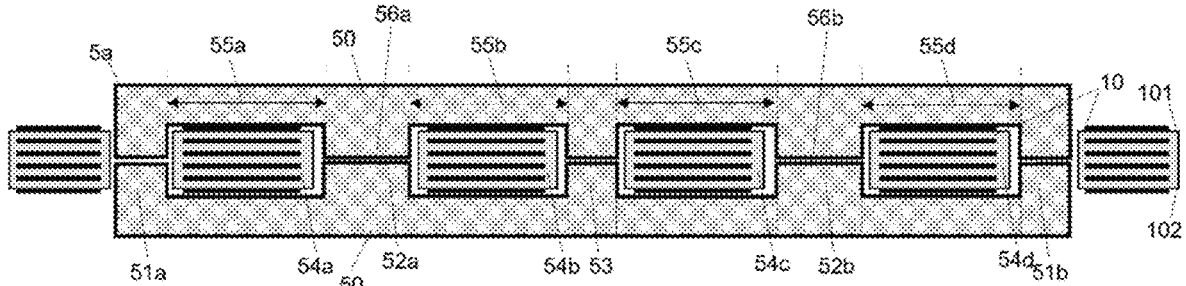
Figure 5D:
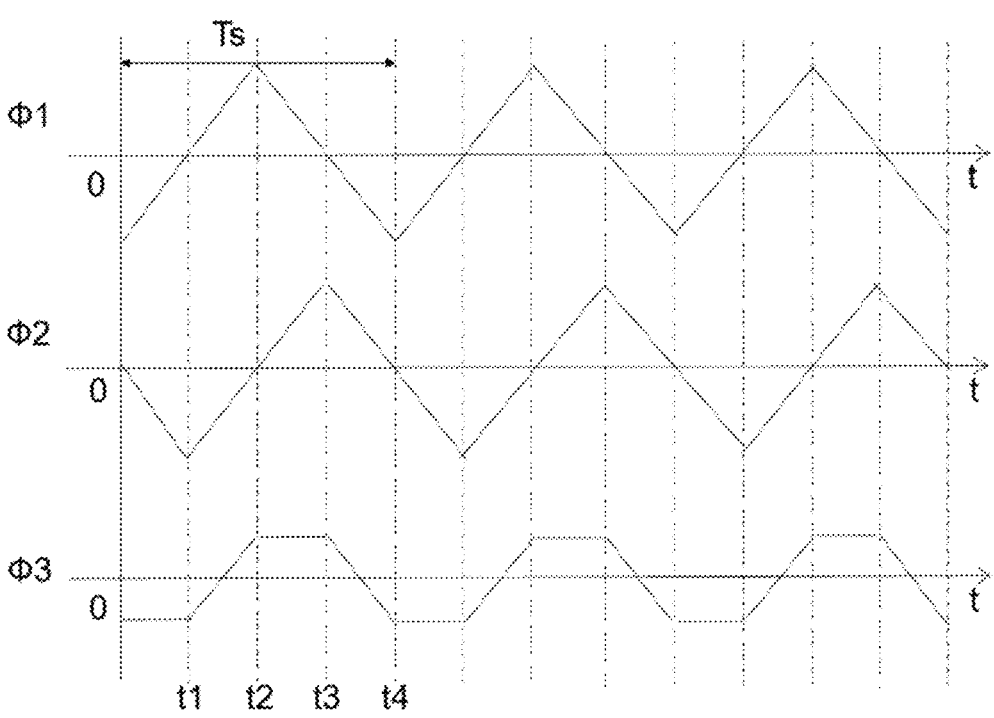
Figure 5E:
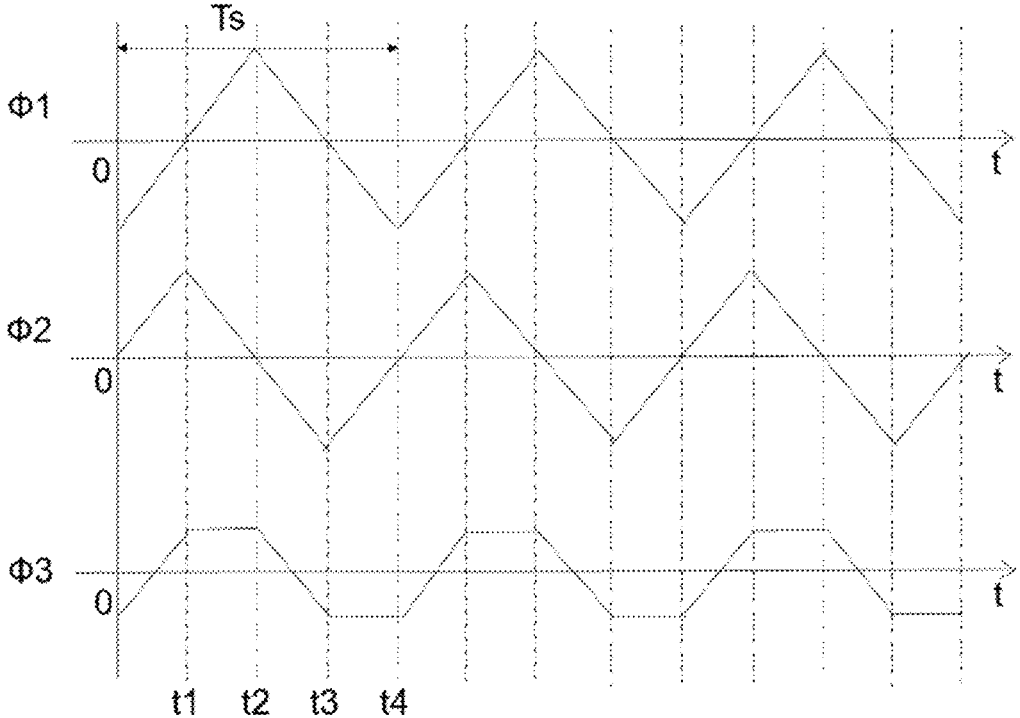
Figure 6A:
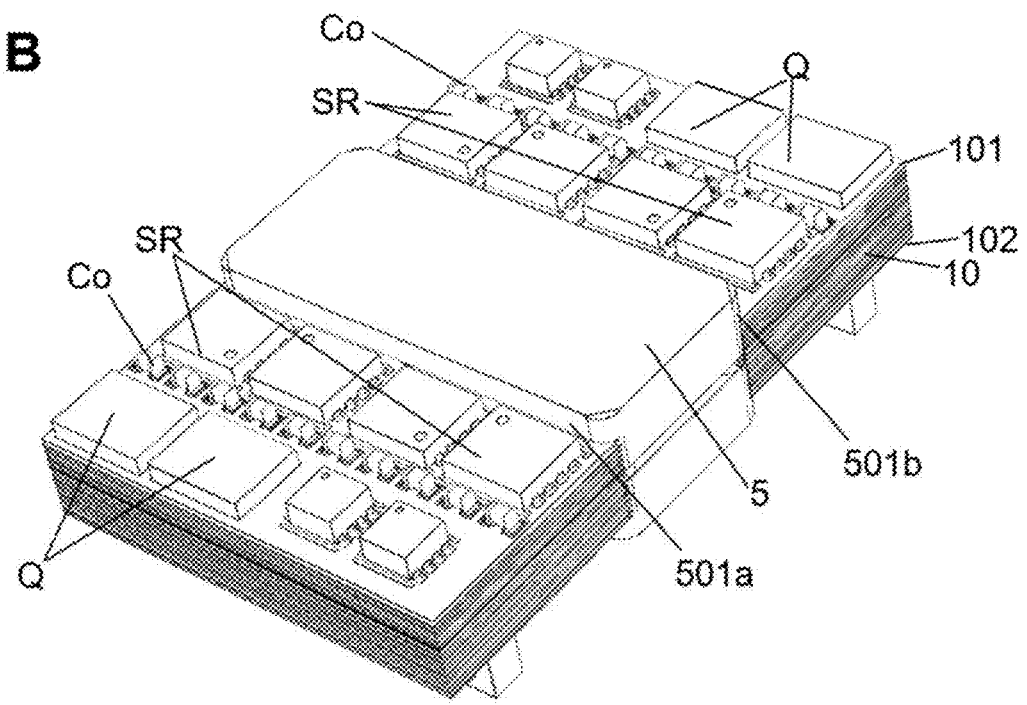
Figure 6B:
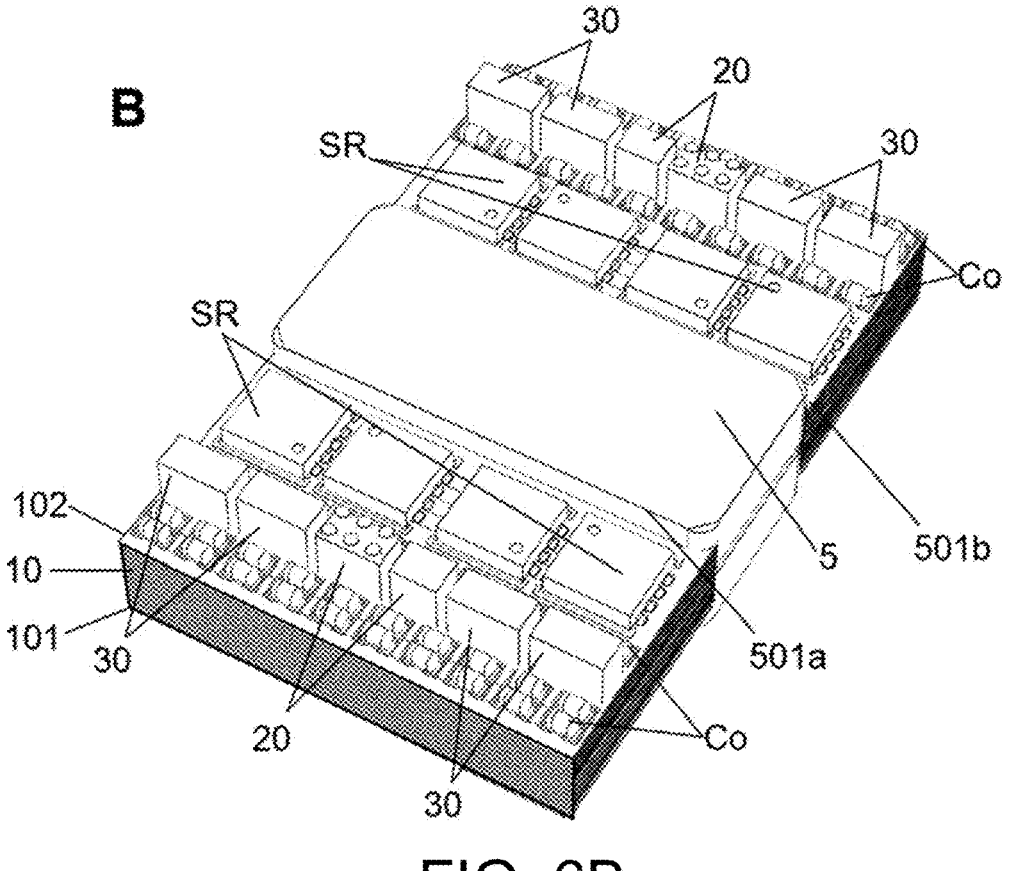

FIG. 4A shows a schematic diagram of circuit topology corresponding to a power module B disclosed in the present embodiment, and FIG. 4B is a timing diagram of control signals required by the power module B. FIG. 5A to FIG. 5E disclose a winding arrangement, a structure of a magnetically permeable core, and variation trends of the magnetic flux over time in a working state, and FIGS. 6A-6C show a schematic structural diagram of a power module B, wherein FIG. 6A is a three-dimensional top view (TOP) of the power module B, FIG. 6B is a three-dimensional bottom view (BOTTOM) of the power module B, and FIG. 6C is a top-view explosion diagram (TOP) of the power module B.

In Embodiment 1, referring to the circuit topology shown in FIG. 1A, when the switches in the high-voltage circuit 1 are turned off, the electric energy remained in the equivalent resonant inductor Llk is dissipated, and in order to reduce the loss, the inductance of the equivalent resonant inductor Llk is configured to be minimized, so that the energy remained in the equivalent resonant inductor Llk is correspondingly reduced, the loss is reduced, and the efficiency is improved; from another point of view, in order to meet the specification of a same resonant frequency of the power module, the capacitance of the resonant capacitor Cr is configured to be increased inversely proportional to the decrease of the inductance of the equivalent resonant inductor Llk; with the increase of the capacitance of the resonant capacitor Cr, in order to avoid the influence on the resonance period by the ripple voltage between the two ends of the output capacitors Co in the power module, the capacitance of the output capacitors Co in the power module is configured to be correspondingly increased. In general, the equivalent capacitance of the output capacitors Co in the power module is K×K times or more than the equivalent capacitance of the resonant capacitor Cr, (here, K is the gain ratio of the input voltage Vin to the output voltage Vo, namely K=Vin/Vo; the equivalent capacitance does not refer to the nominal capacitance of the capacitor, but to the real capacitance of the capacitors in a working state with the consideration of the influence of various factors on the capacitance such as the DC bias voltage component of the capacitors, the temperature of the capacitors, the AC voltage component of the capacitors, etc.). The capacitance of the resonant capacitor Cr is increased, so that the capacitance of the output capacitors Co in the power module is also increased along with the increase of that of the resonant capacitor Cr, that is, more output capacitors Co in the power module are provided and/or the output capacitors Co are provided with larger sizes, which deviates from the aim of a small size of the power module. In some embodiments, in order to reduce the number and the size of the output capacitors Co in the power module, and to meet the requirement of a small size of the power module, circuit topology of the power module B is disclosed as follows. Referring to the circuit topology shown in FIG. 4A, two circuit units with module-A topology as shown in FIG. 1A are provided, input terminals connected in parallel and output terminals also connected in parallel, that is, in a dual module-A topology, four bridge arms of high-voltage switches are connected in parallel, and second ends of eight low-voltage windings are short-circuited (via the output voltage terminals Vo+) together. Each circuit unit of module-A topology corresponds to a set of control signals, and the two sets of control signals are in a phase offset of 90°

(¼ wave). By comparing with the situation that two sets of control signals are in a same phase (hereinafter referred to as a comparative example), it can be seen that the frequency of the output current (which is in a waveform of sinusoidal half-wave) at the short contact of the eight low-voltage windings of the power module B is four times of switching frequency, and the frequency of the output current at the short-contact of the eight low-voltage windings of comparative example is twice the switching frequency; at aspect of a same output capacitance, the ripple voltage amplitude of the output terminal in the power module B is greatly reduced, and at aspect of a same output terminal ripple voltage amplitude, the capacitance of the output capacitors in the power module B may be greatly reduced, number and size of the output capacitors Co correspondingly greatly reduced. In order to avoid the influence on the resonance period by the ripple voltage at the output terminals in the power module of the comparative example, the equivalent total capacitance of the output capacitors Co in the power module is usually N×K×K times or more than the equivalent capacitance of the resonant capacitor Cr or Cr2 (the resonant capacitor Cr or Cr2 is as shown in FIG. 4A, N is the number of circuit units, i.e., N is equal to 2 in this example, and K is gain ratio of the input and output voltages, namely K=Vin/Vo); while in the power module B, the equivalent total capacitance of the output capacitors Co may be smaller than not only N×K×K times of the equivalent capacitance of the resonant capacitor Cr or Cr2, but also 0.5×N×K×K times or even 0.25×N×K×K times of the equivalent capacitance of the resonant capacitor Cr or Cr2. In a steady state operation, the optimal equivalent total capacitance of the output capacitor Co in the power module B is smaller than 0.25×N×K×K times of the equivalent capacitance of the resonant capacitor Cr or Cr2.

Similarly, the input capacitors Cin in the power module B may also shows the beneficial effects. Compared with the comparative example, the frequency of the input current in sinusoidal half-wave waveform at the short contact of the four bridge arms in the power module B is also increased from two times of the switching frequency to four times of the switching frequency; at aspect of a same input capacitance, the input terminal ripple voltage amplitude in the power module B is also greatly reduced; at aspect of a same input terminal ripple voltage amplitude, the input capacitance in the power module B may be greatly reduced, number and size of the input capacitors Cin correspondingly greatly reduced. In order to avoid the influence on the resonance period by the ripple voltage at the input terminals in the power module of the comparative example, the equivalent total capacitance of the input capacitors Cin in the power module is usually N times or more than the equivalent total capacitance of the resonant capacitors Cr/Cr2 (N is the number of the circuit units, i.e., n is equal to 2); while in the power module B, the equivalent total capacitance of the input capacitors Cin may be smaller than not only N times of the equivalent total capacitance of the resonant capacitors Cr/Cr2, but also 0.5×N times or even 0.25×N times of the equivalent total capacitance of the resonant capacitors Cr/Cr2.

According to the circuit topology shown in FIG. 4A, the power module A shown in FIG. 1A to FIG. 3C is expanded by parallel connections of a plurality of circuit units 8a/b. In the embodiments as mentioned above and as follows, two circuit units are provided for example, the two circuit units are respectively a first circuit unit 8a and a second circuit unit 8b. The magnetic apparatus may be provided with individual parts for each circuit unit, and may also be provided with a five-leg magnetically permeable core 5a for two circuit units as shown in FIGS. 5A-5E. FIG. 5A shows a top perspective schematic diagram of the high-voltage windings W1/W4 around the magnetically permeable core 5a. FIG. 5B shows a winding arrangement for the low-voltage windings and the corresponding low-voltage circuit 2. FIG. 5C shows a vertical cross-sectional view of the magnetic apparatus. The magnetically permeable core 5a comprises five core legs, wherein two winding core legs and three non-winding core legs are provided and respectively referred to as a first side core leg 51a, a first winding core leg 52a, a public core leg 53, a second winding core leg 52b and a second side core leg 51b, arranged sequentially between two core plates 50. The cross sections of the first and second winding core legs 52a/b are approximately the same in shape and approximately equal in area; the cross sections of the first side core leg 51a, the public core leg 53 and the second side core leg 51b are approximately the same in shape and approximately equal in area; and cross sectional area of each of the first side core leg 51a, the public core leg 53 and the second side core leg 51b is approximately half of cross sectional area of each winding core leg 52a/b; the magnetically permeable core 5a is equivalent to the two magnetically permeable cores 5 arranged side by side, and the two adjacent side core legs are integrated into the public core leg 53; and the channels between every two adjacent core legs are respectively referred to as a first winding channel 54a, a second winding channel 54b, a third winding channel 54c and a fourth winding channel 54d, the high-voltage windings and the low-voltage windings passing through the winding channels. Parts of the two core plates 50 corresponding to top and bottom walls of each winding channel is referred to as channel walls 55a, channel walls 55b, channel walls 55c and channel walls 55d, and cross-sectional area of each channel wall 55a/b/c/d is approximately half of cross-sectional area of each winding core leg 52a/b.

As shown in FIG. 5A, a high-voltage winding W1 and a high-voltage winding W4 are wound around the magnetically permeable core 5a. Referring to FIG. 4A, the high-voltage winding W1 starts from a dotted end (i.e., a first end), passes through the second winding channel 54b in a first direction (i.e., from top to bottom), passes through the first winding channel 54a in a second direction (i.e., from bottom to top), and is horizontally wound clockwise around the first winding core leg 52a, multi-turn winding arranged on a same wiring layer of the winding substrate 10; similarly, the high-voltage winding W4 starts from a dotted end (i.e., a first end), passes through the fourth winding channel 54d in the first direction (i.e., from top to bottom), passes through the third winding channel 54c in the second direction (i.e., from bottom to top), and is horizontally wound clockwise around the second winding core leg 52b, multi-turn winding arranged on a same wiring layer of the winding substrate 10; the winding arrangement of the high-voltage windings W1/W4 are not limited thereto. As long as the high-voltage winding passes alternately through two adjacent winding channels and alternately in the first direction and the second direction and are wound around the winding core leg in a same direction, multi-turn winding is not limited to be arranged within one wiring layer. In some embodiments, the high-voltage winding W1/W2 are arranged on more than one wiring layer, and layer-to-layer electrical connections are formed through vias.

FIG. 5B is a schematic diagram of the low-voltage windings and the low-voltage circuit 2 arranged around the magnetically permeable core 5a, the winding arrangement and the connection arrangement of the synchronous rectification switches are similar to those shown in FIG. 2D. The first circuit unit 8*a* comprises two switching circuits and two winding groups; the two switching circuits are respectively a first switching circuit and a second switching circuit; the first switching circuit comprises a synchronous rectification switch SR2 and a synchronous rectification switch SR1; sources of the synchronous rectification switch SR2 and the synchronous rectification switch SR1 are electrically connected to output negative terminals Vo−; drain of the synchronous rectification switch SR2 is electrically connected to the dotted end (i.e., the first end) of the low-voltage winding W21, the low-voltage winding W21 passes through the first winding channel 54*a* from the dotted end in the second direction, and the non-dotted end (i.e. the second end) of the low-voltage winding W21 is electrically connected to an output positive terminal Vo+; drain of the synchronous rectification switch SR1 is electrically connected to the non-dotted end (i.e., the first end) of the low-voltage winding W22, the low-voltage winding W22 passes through the second winding channel 54*b* from the non-dotted end in the second direction, and the dotted end (i.e., the second end) of the low-voltage winding W22 is electrically connected to the output positive terminal Vo+. The first end of the low-voltage winding W21 and the first end of the low-voltage winding W22 are arranged on the first winding channel side 501*a*, the second end of the low-voltage winding W21 and the second end of the low-voltage winding W22 are arranged on the second winding channel side 501*b*, and the first winding group (i.e., the low-voltage winding W21 and the low-voltage winding W22) is wound clockwise from the dotted end of the low-voltage winding W21 to the non-dotted end of the low-voltage winding W22 for one turn in total around the first winding core leg 52*a*, that is, the low-voltage winding W21 is wound around the first winding core leg 52*a* for 0.5 turn, the low-voltage winding W22 is wound around the first winding core leg 52*a* for another 0.5 turn, and the first winding group is located on a same wiring layer of the winding substrate 10. The low-voltage winding W21 and the low-voltage winding W22 may also be formed on different wiring layers of the winding substrate 10 and short-circuited through a via which is also electrically connected to the output positive terminal Vo+. Similarly, the second switching circuit comprises a synchronous rectification switch SR3 and a synchronous rectification switch SR4; sources of the synchronous rectification switch SR3 and the synchronous rectification switch SR4 are electrically connected to output negative terminals Vo−; drain of the synchronous rectification switch SR4 is electrically connected to the dotted end (i.e., the first end) of the low-voltage winding W31, the low-voltage winding W31 passes through the second winding channel 54*b* from the dotted end in the first direction, and the non-dotted end (i.e., the second end) of the low-voltage winding W31 is electrically connected to an output positive terminal Vo+; drain of the synchronous rectification switch SR3 is electrically connected to the non-dotted end (i.e., the first end) of the low-voltage winding W32, the low-voltage winding W32 passes through the first winding channel 54*a* from the non-dotted end in the first direction, and the dotted end (i.e., the second end) of the low-voltage winding W32 is electrically connected to the output positive terminal Vo+. Therefore, the first end of the low-voltage winding W31 and the first end of the low-voltage winding W32 are arranged on the second winding channel side 501*b*, the second end of the low-voltage winding W31 and the second end of the low-voltage winding W32 are arranged on the first winding channel side 501*a*, and the second winding group (i.e., the low-voltage winding W31 and the low-voltage winding W32) is wound clockwise from the dotted end of the low-voltage winding W31 to the non-dotted end of the low-voltage winding W32 for one turn in total around the first winding core leg 52*a*, that is, the low-voltage winding W31 is wound around the first winding core leg 52*a* for 0.5 turn, and the low-voltage winding W32 is wound around the first winding core leg 52*a* for another 0.5 turn, and the second winding group is located on a same wiring layer of the winding substrate 10. The low-voltage winding W31 and the low-voltage winding W32 may also be formed on different wiring layers of the winding substrate 10 and short-circuited through a via which is also electrically connected to the output positive terminal Vo+.

The second circuit unit 8*b* comprises two switching circuits and two winding groups; the two switching circuits are respectively a third switching circuit and a fourth switching circuit; the third switching circuit comprises a synchronous rectification switch SR5 and a synchronous rectification switch SR6; sources of the synchronous rectification switch SR6 and the synchronous rectification switch SR5 are electrically connected to output negative terminals Vo−; drain of the synchronous rectification switch SR6 is electrically connected to the dotted end (i.e., the first end) of the low-voltage winding W51, the low-voltage winding W51 passes through the third winding channel 54*c* from the dotted end in the second direction, and the non-dotted end (i.e., the second end) of the low-voltage winding W51 is electrically connected to an output positive terminal Vo+; drain of the synchronous rectification switch SR5 is electrically connected to the non-dotted end (i.e., the first end) of the low-voltage winding W52, the low-voltage winding W52 passes through the fourth winding channel 54*d* from the non-dotted end in the second direction, and the dotted end (i.e., the second end) of the low-voltage winding W52 is electrically connected to the output positive terminal Vo+. Therefore, the first end of the low-voltage winding W51 and the first end of the low-voltage winding W52 are arranged on the first winding channel side 501*a*, the second end of the low-voltage winding W51 and the second end of the low-voltage winding W52 are arranged on the second winding channel side 501*b*, and the third winding group (ie, the low-voltage winding W51 and the low-voltage winding W52) is wound clockwise from the dotted end of the low-voltage winding W51 to the non-dotted end of the low-voltage winding W52 for one turn in total around the second winding core leg 52*b*, that is, the low-voltage winding W51 is wound around the second winding core leg 52*b* for 0.5 turn, the low-voltage winding W52 is wound around the second winding core leg 52*b* for another 0.5 turn, and the third winding group is located on the same wiring layer of the winding substrate 10. The low-voltage winding W51 and the low-voltage winding W52 may also be respectively formed on different wiring layers of the winding substrate 10 and short-circuited through a via which is also electrically connected to the output positive terminal Vo+. Similarly, the fourth switching circuit comprises a synchronous rectification switch SR7 and a synchronous rectification switch SR8; sources of the synchronous rectification switch SR7 and the synchronous rectification switch SR8 are electrically connected to output negative terminals Vo−; drain of the synchronous rectification switch SR8 is electrically connected to the dotted end (i.e., the first end) of the low-voltage winding W61, the low-voltage winding W61 passes through the fourth winding channel 54*d* from the dotted end in a first direction, and the non-dotted end (i.e., the second end) of the low-voltage winding W61 is electrically connected to an output positive terminal Vo+; drain of the synchronous rectification switch SR7 is electrically connected to the non-dotted end (i.e., the first end) of the low-voltage winding W62, the low-voltage winding W62 passes through the third winding channel 54*c* from the non-dotted end in the first direction, and the dotted end (i.e., the second end) of the low-voltage winding W62 is electrically connected to the output positive terminal Vo+. Therefore, the first end of the low-voltage winding W61 and the first end of the low-voltage winding W62 are arranged on the second winding channel side 501*b*, the second end of the low-voltage winding W61 and the second end of the low-voltage winding W62 are arranged on the first winding channel side 501*a*, and the fourth winding group (ie, the low-voltage winding W61 and the low-voltage winding W62) is wound clockwise from the dotted end of the low-voltage winding W61 to the non-dotted end of the low-voltage winding W62 for one turn in total around the second winding core leg 52*b*, that is, the low-voltage winding W61 is wound around the second winding core leg 52*b* for 0.5 turn, the low-voltage winding W62 is wound around the second winding core leg 52*b* for another 0.5 turn, and the fourth winding group is located on the same wiring layer of the winding substrate 10. The low voltage winding W61 and the low voltage winding W62 may also be formed on different wiring layers of the winding substrate 10 and short-circuited through a via which is also electrically connected to the output positive terminal Vo+. At least four output capacitors Co are respectively arranged on two opposite sides of the magnetically permeable core 5*a*, that is, on the first winding channel side 501*a* and on the second winding channel side 501*b*, and are bridged between the output positive terminal Vo+ and the output negative terminal Vo– of each side. The output positive terminals Vo+ on the two opposite sides of the magnetically permeable core 5*a* are short-circuited, and the output negative terminals Vo– on the two sides of the magnetically permeable core 5*a* are short-circuited. The winding arrangement and device layout shown in FIG. 5B are similar to those of FIG. 2D, the beneficial effects shown in winding arrangement according to FIG. 2D are also shown herein, and details are not described again.

Referring to FIG. 4A and FIG. 4B, each circuit unit 8*a/b* corresponds to a set of control signal groups, wherein the first circuit unit 8*a* corresponds to a first control signal group (i.e., the control signals PWM1-PWM4), and the second circuit unit 8*b* corresponds to a second control signal group (i.e., the control signals PWM5-PWM8); the control signal PWM1 in the first control signal group and the control signal PWM5 in the second control signal group are in a phase offset of 90 degrees; with the control signals PWM2-PWM4 specified according to the control signal PWM1 and the control signals PWM6-PWM8 specified likewise according to the control signal PWM5, the control signal in the first control signal group and the corresponding control signal in the second control signal group are in a phase offset of 90 degrees; the AC magnetic fluxes flowing through the winding core leg 52*a* and the winding core leg 52*b* are clamped by the volt-second of the two high-voltage windings. For example, the AC magnetic flux flowing through the first winding core leg 52*a* is ahead of the AC magnetic flux flowing through the second winding core leg 52*b* by 90 degrees in phase, and as shown in FIG. 5D, the upper chart is the variation trend of AC magnetic flux Φ1 flowing through the first winding core leg 52*a* over time, and the middle chart is the variation trend of AC magnetic flux Φ2 flowing through the second winding core leg 52*b* over time.

Referring to FIG. 5C, AC magnetic flux flowing through the channel wall 55*a* and the first side core leg 51*a* is determined by the volt-second of the low-voltage winding W21 or W32, thus proportional to the magnetic flux Φ1 and the amplitude halved; AC magnetic flux flowing through the channel wall 55*b* is determined by the volt-second of the low-voltage winding W22 or W31, proportional to the magnetic flux Φ1 and the amplitude halved; AC magnetic flux flowing through the channel wall 55*c* is determined by the volt-second of the low-voltage winding W51 or W62, proportional to the magnetic flux Φ2 and the amplitude halved; AC magnetic flux flowing through the channel wall 55*d* and the second side core leg 51*b* is determined by the volt-second of the low-voltage winding W52 or W61, proportional to the magnetic flux Φ2 and the amplitude halved. The variation trend of AC magnetic flux Φ3 flowing through the public core leg 53 over time is shown in the lower chart. The AC magnetic flux flowing through the channel wall 55*b* and the AC magnetic flux flowing through the channel wall 55*c* are superposed on the public core leg 53, and the amplitude of the magnetic flux Φ3 is half of the amplitude of the magnetic flux Φ1 or the magnetic flux Φ2. The variation trend in a switching period (i.e., interval 0-t4) is shown in FIG. 5D. In the interval 0-t1, the magnetic flux Φ3 keeps a minimum value unchanged; in the interval t1-t2, the magnetic flux Φ3 increases from the minimum value to a maximum value; in the interval t2-t3, the magnetic flux Φ3 keeps the maximum value unchanged; and in the interval t3-t4, the magnetic flux Φ3 decreases from the maximum value to the minimum value; the waveform repeats. Since the AC magnetic flux flowing through each of the first side core leg 51*a*, the second side core leg 51*b*, the public core leg 53 and the channel walls 55*a/b/c/d* is half of the AC magnetic flux flowing through the first winding core leg 52*a* or the second winding core leg 52*b*, and the cross sectional area of each of the first side core leg 51*a*, the second side core leg 51*b*, the public core leg 53 and the channel walls 55*a/b/c/d* is configured to be half of the cross sectional area of the first winding core leg 51*a* or the second winding core leg 52*b*, the AC magnetic flux density at any position within the magnetically permeable core 5*a* is approximately equal, the energy loss of the magnetically permeable core 5*a* is reduced, and the utilization rate of the magnetically permeable core 5*a* is improved. For another example, the AC magnetic flux flowing through the first winding core leg 52*a* lags the AC magnetic flux flowing through the second winding core leg 52*b* by 90 degrees in phase, and as shown in FIG. 5E, variation trend of the AC magnetic flux Φ3 flowing through the public core leg 53 over time is shown in the lower chart of FIG. 5E. Compared with the AC magnetic flux Φ3 shown in FIG. 5D, the AC magnetic flux Φ3 shown in FIG. 5E is similar in waveform, the same in amplitude, and advanced by 90 degrees in phase.

According to FIG. 5C, further, an air gap 56*a* and an air gap 56*b* are respectively provided at the first winding core leg 52*a* and the second winding core leg 52*b* for increasing the reluctance of the first winding core leg 52*a* and the second winding core leg 52*b*, and the heights of the two air gaps are approximately equal, so that magnetization current is generated in each high-voltage winding for ZVS turn-on in the high-voltage circuit respectively electrically connected. The first side core leg 51*a*, the second side core leg 51*b* and the public core leg 53 are not provided with air gaps in some embodiments; alternatively in some other embodiments, they are respectively provided with air gaps which are approximately equal in height, and the heights are smaller than those of the air gap 56*a* and the air gap 56*b*;

alternatively in some other embodiments, air gaps are provided at the first side core leg 51*a*, the second side core leg 51*b* and the public core leg 53 and the air gaps at all of the five core legs are equal in height, so that on one hand, due to the fact of the same in height, the processing steps on the first winding core leg 52*a* and the second winding core leg 52*b* for setting the height of the air gaps are reduced, and the magnetically permeable core 5*a* is easy to from and assemble; on the other hand, the air gaps of the first winding core leg 52*a* and the second winding core leg 52*b* are shortened, and the air gaps of the first side core leg 51*a*, the second side core leg 51*b* and the public core leg 53 are increased, so that the total amount of eddy current loss generated on the windings by the magnetic flux leakage from the air gaps at the five core legs is reduced, the light-load power loss of the power module B is reduced, and the heavy-load conversion efficiency of the power module B is improved.

The integration of two transformers into a five-leg magnetically permeable core in the two circuit units improves the integration level of the magnetically permeable core; the size of the magnetically permeable core is reduced, and the size of the power module B is consequently reduced.

The three-dimensional structure schematic diagram of the power module B is shown in FIGS. 6A-6C. With reference to the explosion schematic diagram shown in FIG. 6C, five core legs of the magnetically permeable core 5*a* penetrate respectively through five parallel magnetically-permeable-core holes 103, which match the core legs in number and shape and formed in the winding substrate 10, and two core sections cover the first surface 101 and the second surface 102 of the winding substrate 10 to form closed magnetic circuits. The structure of the magnetically permeable core 5*a* is not limited to an assembly of two E-shaped cores sections as shown in the figure, and may also be an assembly of an I-shaped core section and an E-shaped core section; alternatively in some embodiments, the two core plates and the five core legs are individual core sections. After the magnetically permeable core 5*b* is assembled with the substrate, the region in the winding substrate 10 between each two adjacent magnetically-permeable-core holes 103 correspond to one winding channel, and the winding channels are respectively referred to as a first winding channel 54*a*, a second winding channel 54*b*, a third winding channel 54*c* and a fourth winding channel 54*d*; two opposite side surfaces of the magnetically permeable core 5*a* according to the terminals of the four winding channels are respectively referred to as a first winding channel side 501*a* and a second winding channel side 501*b*. The synchronous rectification switches SR are equally arranged on the first and second surfaces 101/102 of the winding substrate 10; and on the first surface 101, the synchronous rectification switches SR is further equally arranged on the first and second winding channel sides 501*a/b*. The first switching circuit and the third switching circuit are arranged on the first winding channel side 501*a*, the second switching circuit and the fourth switching circuit are arranged on the second winding channel side 501*b*. The synchronous rectification switches SR located on the same winding channel side on each surface of the winding substrate 10 is arranged along a switch position line, the switch position line is defined as a straight line penetrating through all synchronous rectification switches SR on the same surface and on the same winding channel side, and the switch position line is approximately perpendicular to the direction through the winding channels; the arrangement of the synchronous rectification switches SR on the second surface 102 is similar to those on the first surface 101, and details are not described herein again. In addition, the synchronous rectification switches SR on the first surface 101 are in one-to-one correspondence to those on the second surface 102, forming a plurality of synchronous rectification switch pairs. The projections of the two synchronous rectification switches in each synchronous rectification switch pair to the first surface 101 partially overlap or wholly coincide with each other, so that the drains or the sources of the two synchronous rectification switches in each synchronous rectification switch pair may be short-circuited by a vertical via through the winding substrate 10 just at the position of the bonding pads of the synchronous rectification switches as well as other kind of via. The output capacitors Co are divided into two groups which are respectively arranged on the outer side of the synchronous rectification switches SR. In each group, the output capacitors are further arranged on the first surface 101 and the second surface 102 in pairs, and the projections of the output capacitors Co in each pair to the first surface 101 partially overlap or wholly coincide with each other, so that the output capacitors on the first and second surfaces 101/102 may be electrically connected in parallel by vertical vias through the substrate 10 just at the positions of the bonding pads as well as other kinds of vias. The output capacitors Co are evenly distributed on the outer side of the synchronous rectification switches, so that the drains of the synchronous rectification switches in each switching circuit are connected to the first end of the corresponding low-voltage winding at a shortest distance, the sources of the synchronous rectification switch in each switching circuit are adjacent to each other; the alternating current loop formed by each switching circuit and the corresponding winding electrically connected is minimized. Therefore, the parasitic leakage inductance of the loop and the alternating current resistance of the loop are greatly reduced, the loss of the power module B is reduced, and the efficiency is improved. The output pins 30 are placed on the second surface 102 of the winding substrate 10, divided into two groups, and arranged on the outer side of the synchronous rectification switch group. The output pins 30 may be arranged on the outer side of the arrangement region of the output capacitors Co, or between the arrangement regions of the output capacitors Co and the synchronous rectification switch group, or within the arrangement region of the output capacitors Co, as shown in FIG. 6B; output pins 30 in each group is arranged along an output pin position line, and the output pin position line is defined as a straight line penetrating through at least three output pins in the same group. In some embodiments, the output pin position line penetrates through all the output pins in the same group, and the output pin position line is approximately perpendicular to the direction through the winding channels. According to the arrangement of the output pins 30, the output pins 30 may be respectively arranged adjacent to the switching circuits on the two sides of the winding channel, the parasitic resistance from the switching circuit to the output pin is greatly reduced, and the loss caused by the parasitic resistance is reduced. In some embodiments, the input pins 20 are also divided into two groups which are respectively arranged on the outer side of the synchronous rectification switch group, and each group of input pins 20 and a corresponding group of output pins 30 on the same side are arranged side by side; the arrangement of the input pins 20 is not limited thereto.

In other words, as shown in FIG. 6D, the area on the second surface 102 of the winding substrate 10 is divided into a first output region 91*a*, a first switch region 92*a*, a core assembly region 93, a second switch region 92b and a second output region 91b. The first output region 91a, the first switch region 92a, the core assembly region 93, the second switch region 92b and the second output region 91b are sequentially arranged in the same direction. With reference to FIG. 6B, some or all of the components of the magnetic apparatus 3 are arranged within the magnetic assembly region 93, some of the switching circuits of the power module B are arranged within the first switch region 92a, and others of the switching circuits are arranged within the second switch region 92b. In some embodiments, the switch SR1 in the first switching circuit, the switch SR2 in the first switching circuit, the switch SR5 in the third switching circuit and the switch SR6 in the third switching circuit are all arranged within the first switch region 92a, the switch SR3 in the second switching circuit, the switch SR4 in the second switching circuit, the switch SR7 in the fourth switching circuit, and the switch SR8 in the fourth switching circuit are arranged within the second switch region 92b. In some embodiments, one group of output pins 30 and one group of output capacitors Co are arranged within the first output region 91a, and another group of output pins 30 and another group of output capacitors Co are arranged within the second output region 91b; the layout of the first output region and the second output region are not limited to those shown in FIG. 6B and FIG. 6D. In some embodiments, only output pins 30 are arranged within the first and second output regions; in some other embodiments, only output capacitors Co are arranged within the first and second output regions.

On one side of the second surface of the power module B in some embodiments, a first group of output pins, the first switching circuit, the magnetically permeable core, the second switching circuit and a second group of output pins are sequentially arranged in the same direction; in some other embodiments, a first group of output capacitors, the first switching circuit, the magnetically permeable core, the second switching circuit and a second group of output capacitors are sequentially arranged in the same direction; alternatively in some other embodiments, a first group of output pins, a first group of output capacitors, the first switching circuit, the magnetic permeable core, the second switching circuit, a second group of output capacitors and a second group of output pins are sequentially arranged in the same direction. Three layouts of devices all show the described beneficial effects. In addition, the power module A according to FIG. 3A-3C may also be provided with a similar layout.

Embodiment 3

Figure 7A:
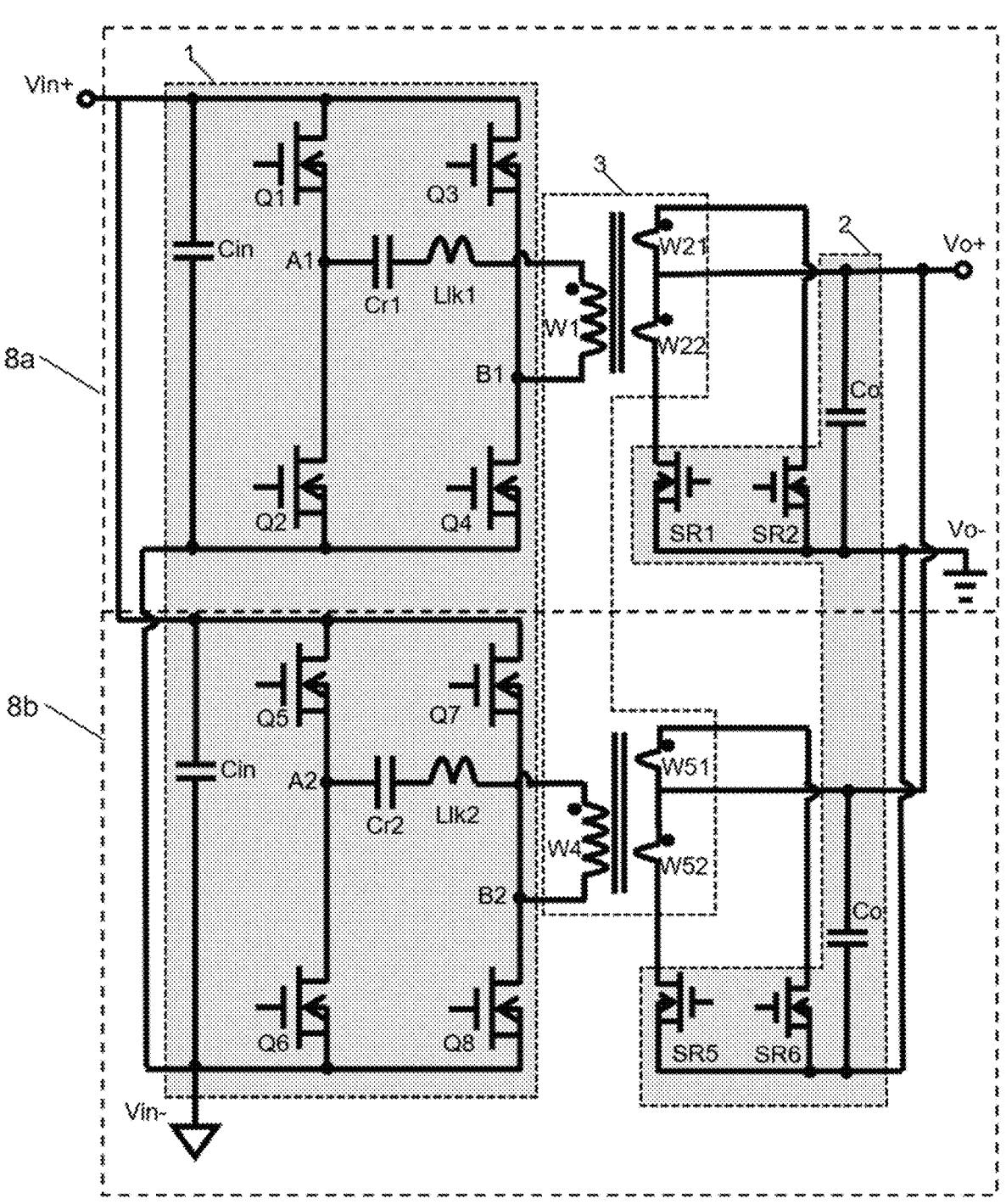
FIG. 7A to FIG. 7C are schematic diagrams of Embodiment 3.
Figure 7B:
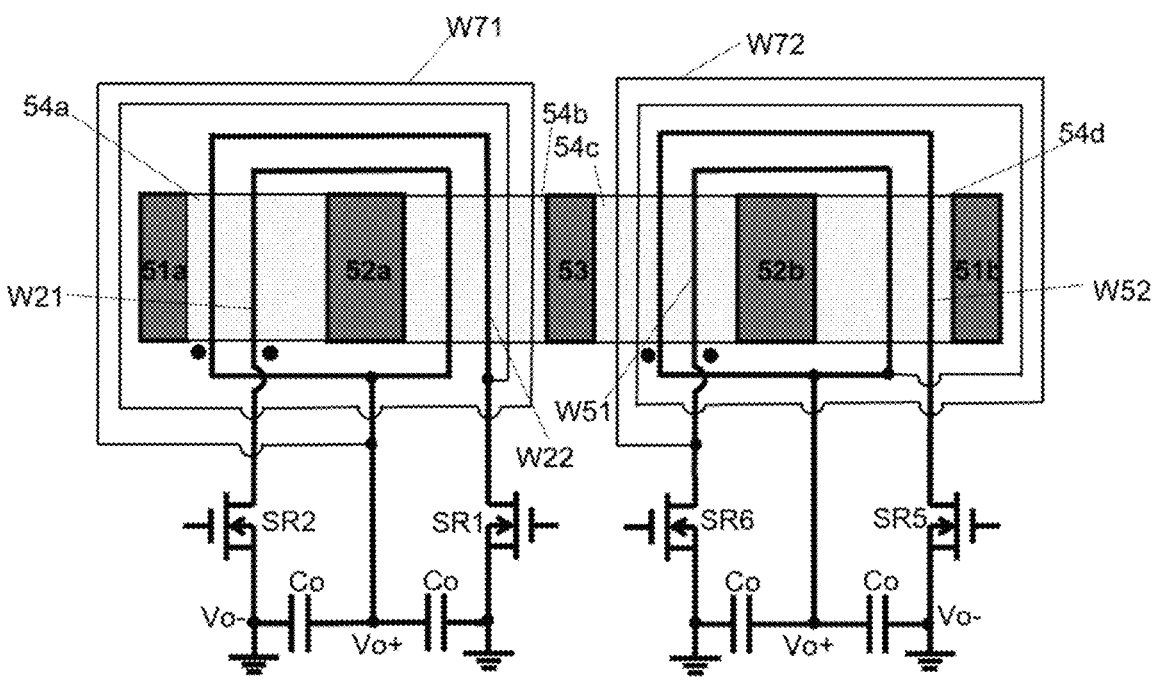
Figure 7C:
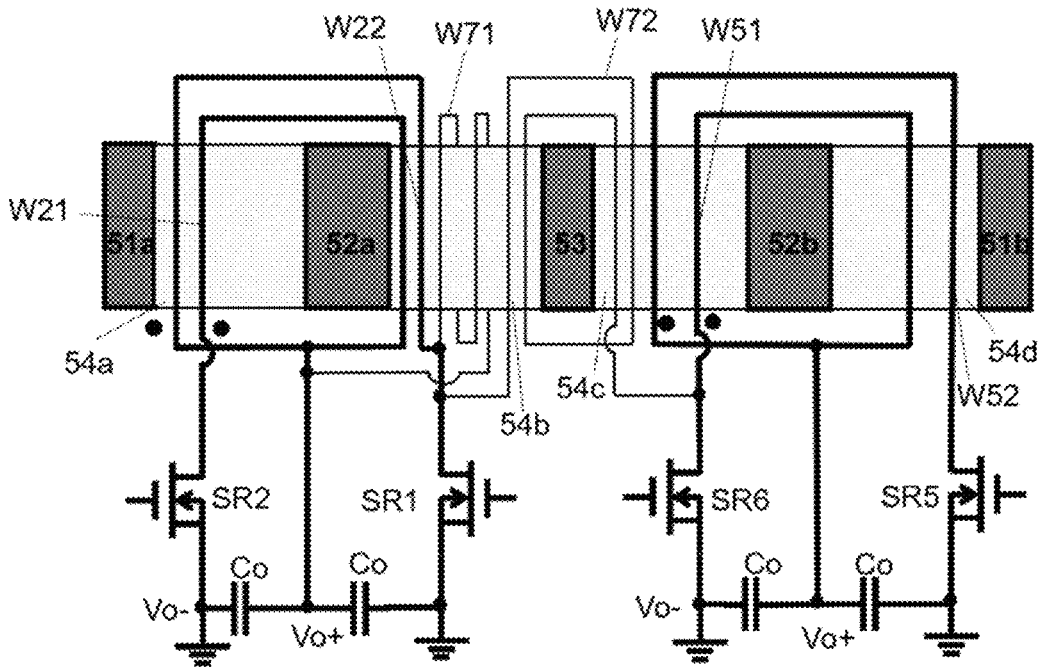

FIGS. 7A-7C show a circuit topology schematic diagram of Embodiment 3, a structure of a magnetic apparatus, and a corresponding winding method. The circuit topology diagram shown in FIG. 7A comprises two circuit units, but is different from the circuit topology schematic diagram shown in FIG. 4A, the circuit topology shown in FIG. 7A comprises a first circuit unit 8a and a second circuit unit 8b, the second circuit unit 8b only comprises a third winding group (i.e., the low-voltage winding W51 and the low-voltage winding W52) and a second switching circuit (i.e., the synchronous rectification switch SR5 and the synchronous rectification switch SR6), and the number of turns of the low-voltage winding in each circuit unit is changed from 0.5 turn to one turn. The two transformers shown in FIG. 7A are also integrated in a five-leg magnetically permeable core 3, high-voltage windings are wound on the two winding core legs of the five-leg magnetically permeable core respectively, the winding method of the high-voltage winding is similar to that of FIG. 5A, and details are not repeated here; the winding method of the low-voltage winding and the position and connection relationship of the synchronous rectification switch are as shown in FIG. 7B or FIG. 7C, the first switching circuit of the first circuit unit 8a comprises two synchronous rectification switches SR1 and a synchronous rectification switch SR2, and after the sources of the synchronous rectification switch SR1 and the synchronous rectification switch SR2 are short-circuited, the synchronous rectification switch SR1 and the synchronous rectification switch SR2 are connected to the output negative terminal Vo− (i.e., the negative voltage terminal of the output capacitor Co), the drain of the synchronous rectification switch SR2 is electrically connected to the first end (i.e., the dotted end) of the low-voltage winding W21, the drain of the synchronous rectification switch SR1 is electrically connected to the first end (i.e., the non-dotted end) of the low-voltage winding W22, and the second end of the W22 of the low-voltage winding and the second end of the low-voltage winding W21 are electrically connected to an output positive terminal Vo+ (i.e., the positive voltage terminal of an output capacitor Co), the low-voltage winding W21 passes through the first winding channel 54a in a second direction (such as from bottom to top) from the dotted end to the non-dotted end, and then passes through the second winding channel 54b in a first direction (such as from top to bottom); the low-voltage winding W22 passes through the second winding channel 54b from the non-dotted end to the dotted end in the second direction and then passes through the first winding channel 54a in the first direction; therefore, the first winding is combined from the dotted end of the low-voltage winding W21 to the non-dotted end of the low-voltage winding W22 clockwise around the first winding core leg 52a for two turns, that is, the low-voltage winding W21 is wound around the first winding core leg 52a for one turn, and the low-voltage winding W22 is wound around the first winding core leg 52a for one turn. The second switching circuit of the second circuit unit comprises two synchronous rectification switches SR5 and SR6, and the sources of the synchronous rectification switches SR5 and SR6 are short-circuited and then connected to the output negative terminal Vo− (i.e., the negative voltage terminal of the output capacitor Co), the drain of the synchronous rectification switch SR6 is electrically connected to the first end (i.e., the dotted end) of the low-voltage winding W51; the drain of the synchronous rectification switch SR5 is electrically connected to the first end (i.e., the non-dotted end) of the low-voltage winding W52; the second end of the low-voltage winding W52 and the second end of the low-voltage winding W51 are electrically connected to an output positive terminal Vo+ (i.e., a positive voltage terminal of an output capacitor Co); the low-voltage winding W52 passes through the fourth winding channel 54d from the non-dotted end to the dotted end in the second direction, and then passes through the third winding channel 54c in the first direction; therefore, the third winding is combined from the dotted end of the low-voltage winding W51 to the non-dotted end of the low-voltage winding W52 to be wound clockwise around the second winding core leg 52b for two turns, that is, the low-voltage winding W51 is wound around the second winding core leg 52b for one turn, and the low-voltage winding W52 is wound around the second winding core leg 52b for one turn. In some embodiments, the first end and the second end of each low-voltage winding extends out of the same winding channel side, the switches SR1/SR2/SR5/SR6 are all arranged on the same winding channel side (i.e., the first winding channel side 501*a*).

The magnetic apparatus further comprises an additional winding 71 and an additional winding 72; one end of the additional winding 71 is electrically connected with the drain of the switch SR1, the other end of the additional winding 71 is electrically connected with the output positive terminal Vo+, the additional winding 71 passes through the second winding channel 54*b* in the same direction twice and is wound anticlockwise around the first side core leg 51*a* and the first winding core leg 52*a* as a whole, so that the variation trend of the AC magnetic flux flowing through the first side core leg 51*a* and the channel wall 55*b* over time is controlled by the volt-second of the two ends of the additional winding 71. In addition, the additional winding 71 is equivalent to being connected in parallel with the low-voltage winding W22, so that the AC magnetic flux flowing through the first side core leg 51*a* is opposite in direction and half in amplitude compared with the AC magnetic flux flowing through the first winding core leg 52*a*; furthermore, since the AC magnetic flux flowing through the first side core leg 51*a* and the AC magnetic flux flowing through the channel wall 55*b* are superposed and flow into the first winding post 52*a*, the amplitude of the AC magnetic flux flowing through the first side post 51*a* is equal to the amplitude of the AC magnetic flux flowing through the channel wall 55*b*. Similarly, one end of the additional winding 72 is electrically connected with the drain of the switch SR6, the other end of the additional winding 72 is electrically connected with the output positive terminal Vo+, the additional winding 72 passes through the third winding channel 54*c* in the same direction twice and is wound clockwise around the second side core leg 51*b* and the second winding core leg 52*b* as a whole, so that the variation trend of the AC magnetic flux flowing through the second side core leg 51*b* and the channel wall 55*c* over time is controlled by the volt-second of the two ends of the additional winding 72. In addition, the additional winding 72 is equivalent to being connected in parallel with the low-voltage winding W52, so that the AC magnetic flux flowing through the second side core leg 51*b* is opposite in direction and half in amplitude compared with the AC magnetic flux flowing through the second winding core leg 52*b*; furthermore, since the AC magnetic flux flowing through the second side core leg 51*b* and the AC magnetic flux flowing through the channel wall 55*c* are superposed and flow into the second winding core leg 52*b*, the amplitude of the AC magnetic flux flowing through the second side core leg 51*b* is equal to the amplitude of the AC magnetic flux flowing through the channel wall 55*c*; the variation trend of the AC magnetic flux flowing through the public core leg 53 over time is equal to that of the superposition of the AC magnetic flux flowing through the channel walls 55*b* and 55*c*. By providing the additional winding 71 and the additional winding 72, the AC magnetic flux flowing through the first side core leg 51*a* or the second side core leg 51*b* or the public core leg 53 or each channel wall 55*a/b/c/d* is configured steadily to be half in amplitude of the AC magnetic flux flowing through the winding core leg 52*a* or the winding core leg 52*b*, while the corresponding cross-sectional area is also configured to be half of the cross-sectional area of the winding core leg 52*a* or the winding core leg 52*b*, so that the AC magnetic flux density at any position within the magnetically permeable core is approximately equal, the loss of the magnetically permeable core is reduced, the utilization rate of the magnetically permeable core is improved, and the size of the magnetically permeable core is further reduced.

In the aforementioned description, two switching circuits are provided for example, and the synchronous rectification switches are arranged on the same winding channel side. The implementation of the additional windings in the winding arrangement is not limited thereto, and in some other embodiments four winding groups and four switching circuits is provided as shown in FIG. 4A, and synchronous rectification switches in two switching groups are arranged on the other winding channel side (i.e., the second winding channel side 502*b*), so that all the synchronous rectification switches are evenly arranged on the two winding channel sides.

The winding arrangement of the additional windings 71 and 72 is not limited to the winding arrangement shown in FIG. 7B. In some embodiments, as shown in FIG. 7C, the additional winding 71 is wound in the same direction around the channel wall 55*b* of any core plate 50 for two turns, so that the same technical effect as that of the additional winding 71 shown in FIG. 7B is obtained, that is, the AC magnetic flux flowing through the channel wall 55*b* is configured to be half in amplitude of the AC magnetic flux flowing through the first winding core leg 52*a*, resulting that the AC magnetic flux flowing through the first side core leg 51*a* is opposite in direction and half in amplitude compared with the AC magnetic flux flowing through the first winding core leg 52*a*; one end of the additional winding 72 is connected with the drain of the synchronous rectification switch SR1, the other end of the additional winding 72 is connected with the drain of the adjacent synchronous rectification switch SR6, and the additional winding 72 is wound around the public core leg 53 clockwise for two turns, so that the AC magnetic flux flowing through the public core leg 53 is configured to be proportional in variation trend over time and half in amplitude compared with the superposition of the AC magnetic fluxes flowing through the first winding core leg 52*a* and the second winding core leg 52*b*, resulting that the AC magnetic flux flowing through the channel wall 55*c* is half in amplitude of the AC magnetic flux flowing through the second winding core leg 52*b*, and the AC magnetic flux flowing through the second side core leg 51*b* is opposite in direction and half in amplitude compared with the AC magnetic flux flowing through the second winding core leg 52*b*. According to the winding arrangement of the additional winding 71 and the additional winding 72 shown in FIC. 7C, the technical effects of the winding arrangement as shown in FIG. 7B is obtained.

Embodiment 4

Figure 8A:
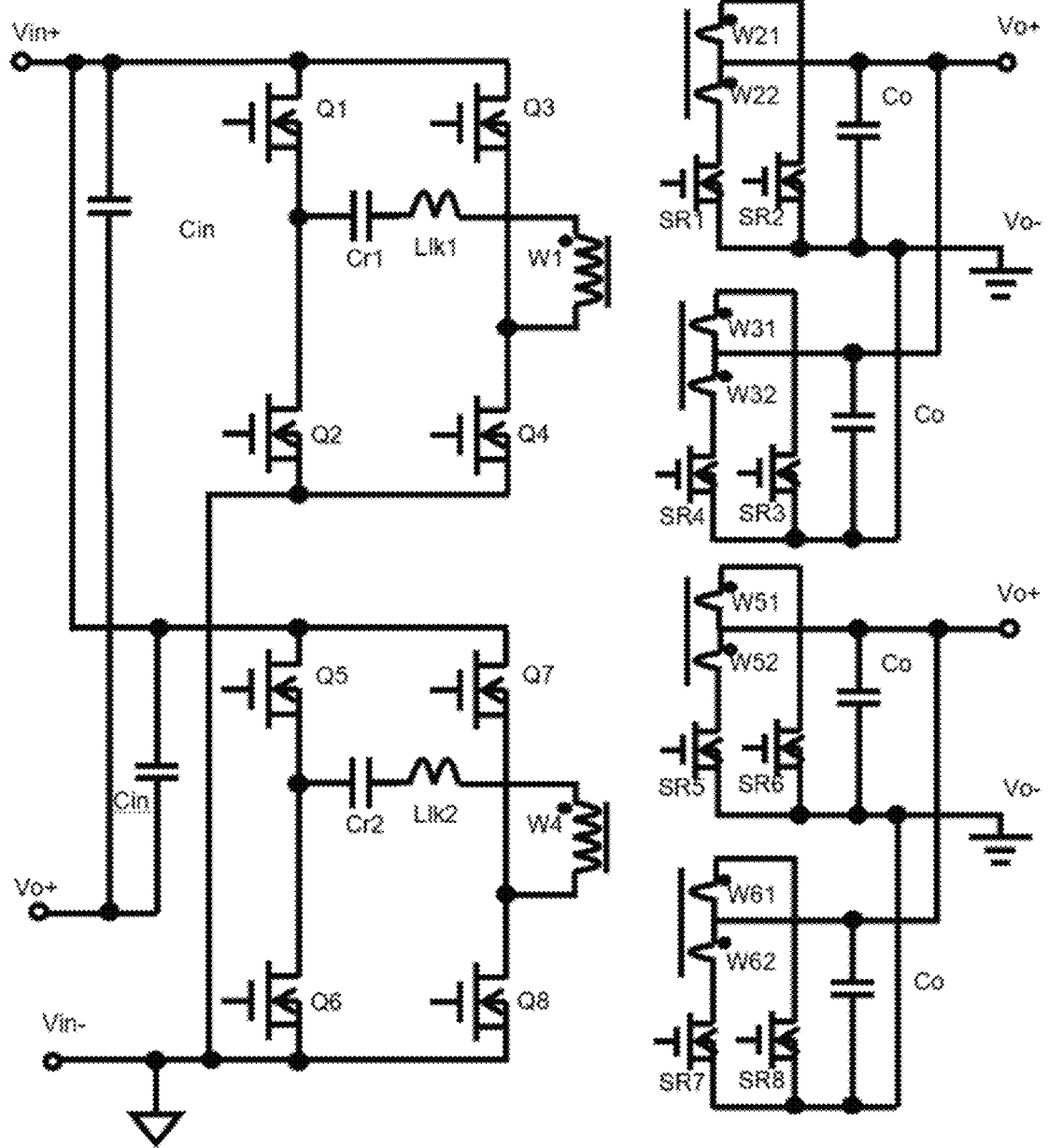
FIG. 8A is a schematic diagram of Embodiment 4.

FIG. 8A shows a schematic circuit topology in some embodiments, which is a substitution for the circuit topology shown in FIG. 4A. The negative voltage terminal of the input capacitor is electrically connected to the output positive terminal Vo+ instead of being electrically connected to the input negative terminal Vin−, so that one part of the output current ripples generated by the eight low-voltage windings flows into the output capacitor Co, and the other part flows into the input capacitor Cin, and is sent to the bridge arms of the high-voltage circuit 1 through the input capacitor Cin, so that the current ripples flowing into the output capacitor Co is reduced, the capacitance of the output capacitor Co or the number of output capacitors Co may be reduced, and the size of the power module is further reduced. Other technical features may be configured according to the embodiments described above, and details are not repeated; the connection arrangement of the input capacitor described herein may be implemented in other embodiments.

Embodiment 5

Figure 8B:
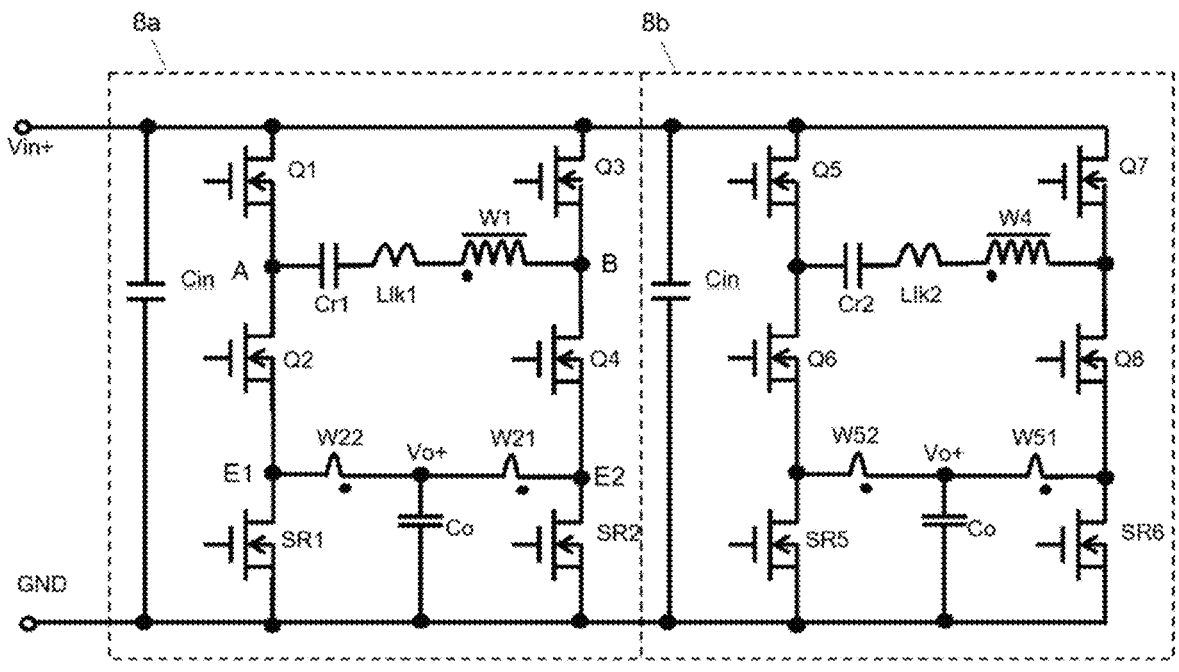
FIG. 8B is a schematic diagram of Embodiment 5.

FIG. 8B shows a schematic circuit topology in some embodiments, which is a substitution for the circuit topology shown in FIG. 7A, comprising two identical circuit units 8*a* and 8*b*. The circuit units 8*a/b* have the same circuit topology and are electrically connected in parallel. Each circuit unit at least comprises two bridge arms, a switching circuit, and a transformer unit. In the first circuit unit 8*a*, the transformer unit comprises a high voltage winding W1 and a first winding group, wherein the first winding group comprises a low voltage winding W21 and a low voltage winding W22; the high-voltage switch Q1 and the high-voltage switch Q2 are electrically connected in series to form a bridge arm, the high-voltage switch Q3 and the high-voltage switch Q4 are electrically connected in series to form the other half bridge arm; the middle nodes of the two bridge arms are referred to as a middle node A and a middle node B; the first switching circuit comprises a synchronous rectification switch SR1 and a synchronous rectification switch SR2, the sources of the switches SR1 and SR2 are electrically connected to the output negative terminal Vo−. One end of each bridge arm is electrically connected to the input positive terminal Vin+, the other end of each bridge arm is electrically connected with the drain of the corresponding synchronous rectification switch, and the two electrical connection nodes are referred to as an electrical connection node E1 and an electrical connection node E2 respectively; the electrical connection node E1 is between a source of the high-voltage switch Q2 and a drain of the synchronous rectification switch SR1; and the electrical connection node E2 is between a source of the high-voltage switch Q4 and a drain of the synchronous rectification switch SR2. The high-voltage winding W1, the equivalent resonant inductor Llk1 and the resonant capacitor Cr1 are connected in series between the middle node A and the middle node B; the second end of the low-voltage winding W21 and the second end of the low-voltage winding W22 are electrically connected to the output positive terminal Vo+; the first end of the low-voltage winding W21 is electrically connected to the node E1, and the first end of the low-voltage winding W22 is electrically connected to the node E2. Each circuit unit is controlled by a set of control signals including a first control signal and a second control signal; the high-voltage switch Q1, the high-voltage switch Q4 and the synchronous rectification switch SR1 are controlled by the first control signal, switched on or switched off at the same time; the duty ratio of the first control signal is close to 50%; the high-voltage switch Q3 and the high-voltage switch Q2 and the synchronous rectification switch SR2 are controlled by the second control signal, switched on or switched off at the same time; the duty ratio of the second control signal is close to 50%. With the dead time between the two control signals ignored, the first control signal and the second control signal are considered as complement to each other (i.e., they are 180 degrees out of phase). The second circuit unit 8*b* comprises two bridge arms, a second switching circuit and a transformer unit. The second switching circuit comprises a synchronous rectification switch SR5 and a synchronous rectification switch SR6. The transformer unit comprises a high-voltage winding W4 and a third winding group, wherein the third winding group comprises a low-voltage winding W51 and a low-voltage winding W52, and the technical features thereof may refer to the first circuit unit 8*a*. In some embodiments, the two transformer units include two discrete magnetically permeable cores, and in some other embodiments a five-leg magnetically permeable core is provided. The high-voltage winding W1, the low-voltage winding W21 and the low-voltage winding W22 are coupled to the same winding core leg to form one transformer unit, and an additional inductor or parasitic leakage inductance of the transformer unit may be provided as the equivalent resonant inductor Llk1; the high-voltage winding W4 and the low-voltage winding W51 and the low-voltage winding W52 are coupled to the other winding core leg to form another transformer unit, and an additional inductor or parasitic leakage inductance of the transformer unit may be provided as the resonant inductor Llk2. The two transformer units may be arranged in a same five-leg magnetically permeable core as shown in FIGS. 5A-5C, and the arrangements and the electrical connections of the low-voltage windings and the switching circuits may refer to the above embodiments for same technical effects.

The two circuit units are controlled in a same way, with the corresponding control signals configured to have a phase offset of 90 degrees. For example, the first control signal for controlling the high-voltage switch Q1 is ahead of or lags the first control signal for controlling the high-voltage switch Q5 by 90 degrees in phase, and the second control signal of the high-voltage switch Q3 is correspondingly ahead of or correspondingly lags the second control signal for controlling the high-voltage switch Q7 by 90 degrees in phase. The described configuration of the circuit units and the corresponding control signals meets the requirements of different input and output voltage gain ratios. Each circuit unit may further include at least one input capacitor Cin and at least one output capacitor Co, as shown in FIG. 8B. The control signals of the aforementioned two circuit units are 90 degrees out of phase with each other, and advantages are obtained that the capacitances of the output capacitors Co and the input capacitors Cin in the power module are greatly reduced. The equivalent total capacitance of the output capacitor Co of the power module may be smaller than not only N×K×K times of the equivalent capacitance of the resonant capacitor Cr1 or Cr2 (N is the number of circuit units, i.e., N is equal to 2 here; K is the input and output voltage gain ratio, namely K=Vin/Vo), but also 0.5×N×K×K times or even 0.25×N×K×K times of equivalent capacitance of the resonant capacitor Cr1 or Cr2. The equivalent total capacitance of the input capacitor Cin may be smaller than not only N times of the equivalent capacitance of the resonant capacitor Cr1 or Cr2, but also 0.5×N times or even 0.25×N times of the equivalent capacitance of the resonant capacitor Cr1 or Cr2.

Embodiment 6

Figure 8C:
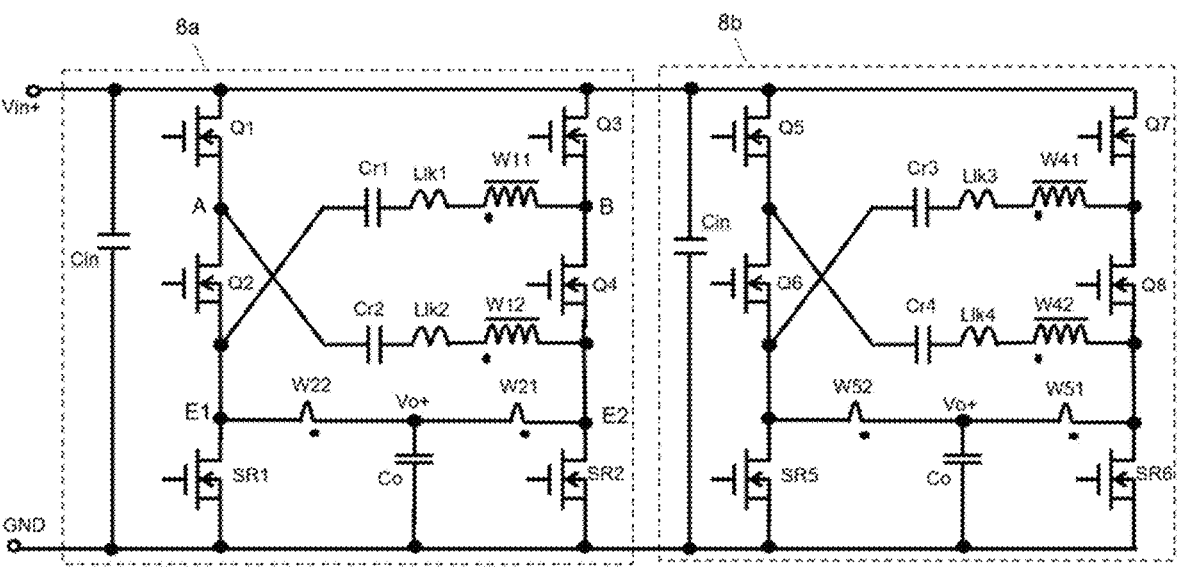
FIG. 8C is a schematic diagram of Embodiment 6.

FIG. 8C discloses a schematic circuit topology diagram in some embodiments, which is a six-switch-per-unit resonant circuit topology, and two circuit units are provided and electrically connected in parallel, which is similar to the embodiments according to FIG. 8B. The difference is that the magnetic apparatus of each circuit unit comprises two high-voltage windings, which are referred to as a high-voltage winding W11 and a high-voltage winding W12 in one circuit unit and a high-voltage winding W41 and a high-voltage winding W42 in another circuit unit; the connection topology of the high-voltage windings in the first circuit unit 8*a* is described in the following for example. The high-voltage winding W11 is connected in series with the equivalent resonance inductor Llk1 and the resonance capacitor CR1 to form a resonance branch which is bridged between the middle node A of the bridge arm and the electrical connection node E2, and the high-voltage winding W12 is connected in series with the equivalent resonant inductor Llk2 and the resonant capacitor Cr2 to form another resonance branch which is bridged between the middle node B of the bridge arm and the electrical connection node E1. That is, the two resonance branches are cross-connected across the middle nodes of the two bridge arms and the electrical connection nodes of the bridge arms and the low-voltage circuits; one end of each resonance branch is electrically connected with the middle node of one bridge arm, and the other end of each resonance branch is electrically connected with the electrical connection node of the other bridge arm and the low-voltage circuit. The high-voltage winding W11 and the high-voltage winding W12 and the low-voltage winding W21 and the low-voltage winding W22 in the first winding group are coupled to a same core leg to form a transformer unit, additional inductors or parasitic leakage inductance of the transformer unit may be provided as the equivalent resonant inductors Llk1/ Llk2. Similarly, the high-voltage winding W41 and the high-voltage winding W42 and the low-voltage winding W51 and the low-voltage winding W52 in the third winding group are coupled to a same core leg to form a transformer unit, additional inductors or parasitic leakage inductance of the transformer unit may be provided as the equivalent resonant inductors Llk3/Llk4; in some embodiments the two transformer units include two discrete magnetically permeable cores, and in some other embodiments a five-leg magnetically permeable core is provided (as shown in FIGS. 5A to 5C). Two circuit units are controlled in a same way, with the corresponding control signals configured to have a phase offset of 90 degrees. By adjusting the ratio of the number of turns of the high-voltage winding to the number of turns of the low-voltage winding, the described configuration meets the requirements of different input and output voltage gain ratios. In some embodiments, the input and output voltage gain ratio K is equal to 4:1, high-voltage windings are not provided in each circuit unit, and only the equivalent resonant inductors and the resonant capacitors are reserved and electrically connected in series across the corresponding nodes. Each circuit unit may further include at least one input capacitor Cin and at least one output capacitor Co, as shown in FIG. 8C. The control signals of the aforementioned two circuit units are 90 degrees out of phase with each other, and advantages are obtained that the capacitances of the output capacitors Co and the input capacitors Cin in the power module are greatly reduced. The equivalent total capacitance of the output capacitors Co of the power module may be smaller than N×K×K times of the equivalent total capacitance Cr of the resonant capacitors (Cr is equal to Cr1+Cr2 or Cr3+Cr4; N is the number of circuit units, i.e., N is equal to 2 here; K is the input and output voltage gain ratio, namely K=Vin/Vo), and may even be smaller than 0.5×N×K×K times or 0.25×N×K×K times of the equivalent total capacitance Cr of the resonant capacitors. The equivalent total capacitance of the input capacitors Cin may be smaller than not only N times of the equivalent total capacitance Cr of the resonant capacitors, but also 0.5×N times or even 0.25×N times of the equivalent total capacitance Cr of the resonant capacitors.

Embodiment 7

Figure 8D:
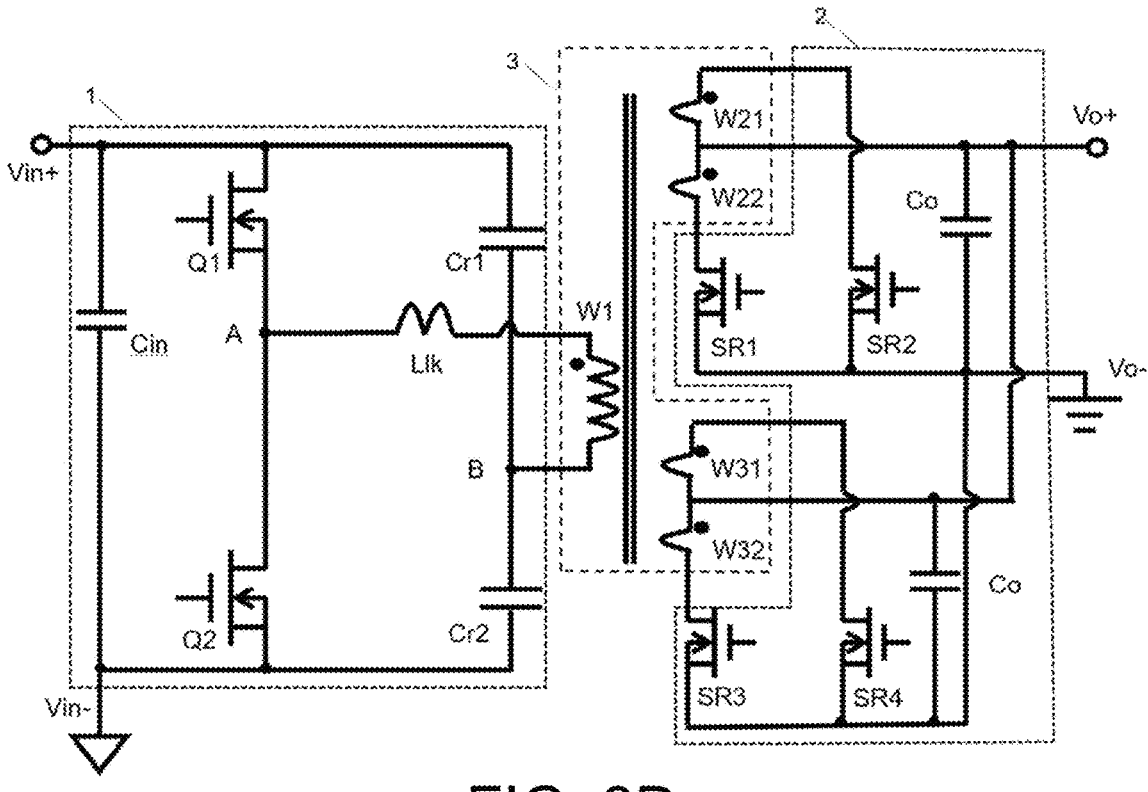
FIG. 8D is a schematic diagram of Embodiment 7.

FIG. 8D is a schematic circuit topology diagram in some embodiments, different from the circuit topology shown in FIG. 1A. The resonant capacitor Cr1 and the resonant capacitor Cr2 are connected in series to form a second bridge arm of capacitors; the second bridge arm is connected in parallel with a first bridge arm of switches; the equivalent resonant inductor Llk and the high-voltage winding W1 in the magnetic apparatus are connected in series to form an LL resonance branch; the LL resonance branch is bridged between the middle node of the first bridge arm and the middle node of the second bridge arm. Through the switching of the high-voltage switch Q1 and the high-voltage switch Q2, the resonant capacitor CR1 or the resonant capacitor CR2 resonates with the equivalent resonant inductor Llk respectively; other technical features are the same as the embodiments shown in FIG. 1A, and the circuit topology described herein may be implemented to the above embodiments.

The switches in the above embodiment are illustrated as Si MOSFET for example, and may also be other kind of switches such as SiC MOSFET, GaN MOSFET, or IGBT MOSFET. The electrical connections of the switches may be correspondingly locally adjusted according to different switch types. The circuit topology shown in the above embodiment may be implemented as a bidirectional converter, that is, the output terminals connected with the low-voltage circuit is changed into input terminals, the input terminals connected with the high-voltage circuit is changed into output terminals, and the corresponding technical features and the beneficial effects are the same; when the high-voltage side serves as input and the voltage between the high-voltage input terminals is Vin, and the low-voltage side serves as output and the voltage between the low-voltage output terminals is Vo, the ratio of the conversion device described as the voltage of the high-voltage side over the voltage of the low-voltage side is K=Vin/Vo; when the high-voltage side serves as output and the voltage between the high-voltage output terminals is Vo, the low-voltage side serves as input and the voltage between the low-voltage input terminals is Vin, the ratio of the conversion device described as a high-over-low voltage ratio is K=Vo/Vin; The phrases "equal" or "same" or "equal to" disclosed by the application needs to consider the parameter distribution of engineering, and the error distribution is within ±30%; the geometric description "parallel" is defined as the included angle between the two line segments or the two straight lines is smaller than or equal to 45 degrees; the geometric description "perpendicular" is defined as the angle between the two line segments or the two straight lines is within the range of [60, 120]; the definition of phase offsets also needs to consider the parameter distribution of engineering, and the error distribution is within ±30%.

Embodiment 8

A current sampling circuit, implementation of the current sampling circuit in a power conversion circuit and structure of a corresponding power conversion device are disclosed as follows. The circuit topology of the power conversion device shown in FIG. 9A for example is a full-bridge LLC circuit topology, wherein the magnetic apparatus 3 comprises only one winding group, and the low-voltage circuit 2 comprises only one switching circuit, an output positive terminal and an output negative terminal. A current sampling circuit 4 is further provided. The current sampling circuit 4 comprises a sampling unit 41 and an amplification unit 42, wherein the sampling unit 41 is provided with a sampling input terminal D1, a sampling input terminal D2, a sampling reference terminal and two sampling output terminals; the sampling input terminal D1 and the sampling input terminal D2 are electrically connected with the first ends of the corresponding low-voltage windings respectively, the sampling reference terminal is electrically connected to the output positive terminal Vo+ (i.e., a first voltage terminal), and the two sampling output terminals are respectively connected to two input terminals of the amplification unit 42. The sampling unit 41 is configured for sampling the voltages at two ends of the connected low-voltage winding, averaging the voltages and outputting the resulted signals through two sampling output terminals; specifically, the sampling unit 41 comprises a sampling resistor R1, a sampling resistor R2, a sampling capacitor C1 and an impedance-matching resistor R6; and when the influence of the distribution parameter is ignored, the resistance of the sampling resistor R1 is equal to that of the sampling resistor R2, and the resistance of the impedance-matching resistor R6 is equal to (or greater than) the equivalent resistance of the sampling resistors R1 and R2 in parallel; one end of the sampling resistor R1 and one end of the sampling resistor R2 are electrically connected to a middle node F of the bridge arm of the sampling resistors R1 and R2, the other ends of the sampling resistors R1 and R2 are electrically connected to the sampling input terminals D1 and the sampling input terminal D2 respectively; one end of the sampling capacitor C1 is electrically connected to the middle node F, and the other end of the sampling capacitor C1 is electrically connected to the sampling reference terminal through the impedance-matching resistor R6; and the two ends of the sampling capacitor C1 are configured as the two sampling output terminals. The amplification unit 42 comprises an operational amplifier OP1 and is provided with an amplification reference terminal, an amplification input positive terminal, an amplification input negative terminal and an amplification output terminal. The amplification reference terminal is electrically connected with the output negative terminal Vo− (i.e., a second voltage terminal). The amplification input positive terminal is electrically connected with a sampling output terminal of the sampling unit 41, that is, the middle node F, and the amplification input negative terminal is electrically connected with the other sampling output terminal of the sampling unit 41. A current sampling signal Vcs is output through the amplification output terminal of the amplification unit 42, and the current sampling signal Vcs is proportional to the working current of the power conversion device.

In operation of the sampling unit 41, with a reference to the output positive terminal Vo+ of the full-bridge LLC circuit, the voltage VD1 at the drain D1 of the switch SR1 is a sum of the coupling voltage component across the low-voltage winding W22 and the resistance voltage component generated across the parasitic resistance of the low-voltage winding W22 by the current flowing through the switch SR1; similarly, the voltage VD2 between the drain D2 of the switch SR2 and the sampling reference terminal is a sum of the coupling voltage component across the low-voltage winding W21 and the resistance voltage component generated across the parasitic resistance of the low-voltage winding W21 by the current flowing through the switch SR2. The voltage VD1 and the voltage VD2 are averaged and input to the sampling capacitor C1 through the sampling resistors R1 and R2 (two signals are superposed and then the average value is taken). The current flowing through the switch SR1 and the current flowing through the switch SR2 are approximately equal in amplitude and 180 degrees out of phase; the coupling voltage component across the low-voltage winding W22 and the coupling voltage component across the low-voltage winding W21 are equal in magnitude and opposite in direction; the two coupling voltage components are self-counteracted on the sampling capacitor C1, so that the sampling resistor R1 and the sampling capacitor C1 do not need to filter the coupling voltage component across the low-voltage winding W22, the sampling resistor R2 and the sampling capacitor C1 do not need to filter the coupling voltage component across the low-voltage winding W21, and only two parasitic resistance voltage components superposed with a phase offset need to be filtered; the time constant formed by the sampling resistor R1 and the sampling capacitor C1 and the time constant formed by the sampling resistor R2 and the sampling capacitor C1 may be greatly reduced, meeting an alleviated requirement of the filtering effect. Under the condition that the output current of the full-bridge LLC circuit changes dynamically, reduced time constants result in an improved tracking speed of the voltage signal across the sampling capacitor C1 (i.e., the output signal of the sampling unit 41, a first output signal) and the current sampling signal Vcs output by the operational amplifier OP1 (i.e., a second output signal). The structure of the amplification unit 42 shown in FIGS. 9A-9B is merely an example, and the functions and implementation of the amplification unit disclosed by the present application are not limited thereto, as long as the voltage of the current sampling signal Vcs of the amplification output terminal is proportional to that of the output signal of the sampling unit 41.

On the other hand, the output signal of the sampling unit 41 or the current sampling signal Vcs output by the amplification unit 42 is proportional to the output current of the full-bridge LLC circuit topology with a proportionality coefficient related to the parasitic resistances of the low-voltage winding W22 and the low-voltage winding W21, that is, the proportionality coefficient varies along with the variation of the parasitic resistances of the low-voltage winding W22 and the low-voltage winding W21. In actual production, the value distribution of the parasitic resistance is influenced by the value distribution of the thicknesses and the widths of the low-voltage winding W22 and the low-voltage winding W21, so that the batch-to-batch difference exists. In some embodiments, as shown in FIG. 9B, the current sampling signal Vcs of the current sampling circuit 4 is sent to a control unit 6. The control unit 6 comprises a calibration unit 61, and the current sampling signal Vcs is calibrated, so that the influence of the value distribution of the parasitic resistance of the low-voltage winding W22 and the low-voltage winding W21 on the amplitude distribution of the output signals of the current sampling circuit 4 is cancelled. At another aspect, the parasitic resistance is influenced by the temperature characteristics of the material of the low-voltage winding W22 and the low-voltage winding W21. The control unit 6 further comprises a temperature compensation unit 62, and temperature compensation is carried out on the current sampling signal Vcs sent into the control unit 6, so that the influence of the temperature of the low-voltage winding W22 and the low-voltage winding W21 on the output signals of the current sampling circuit 4 is compensated. In some embodiments, referring to FIG. 9B, the current sampling signal Vcs is sent to the calibration unit 61 and the temperature compensation unit 62 for calibration or temperature compensation respectively, and then the current sampling signal Vcs is sent to other units for functions such as current reporting, closed-loop current control, current-equalization control or over-current protection. In some embodiments, the current sampling signal Vcs is sent to the calibration unit 61 and the temperature compensation unit 62 in sequence for calibration and temperature compensation, and then the current sampling signal Vcs is sent to other units for the aforementioned functions.

Figure 9A:
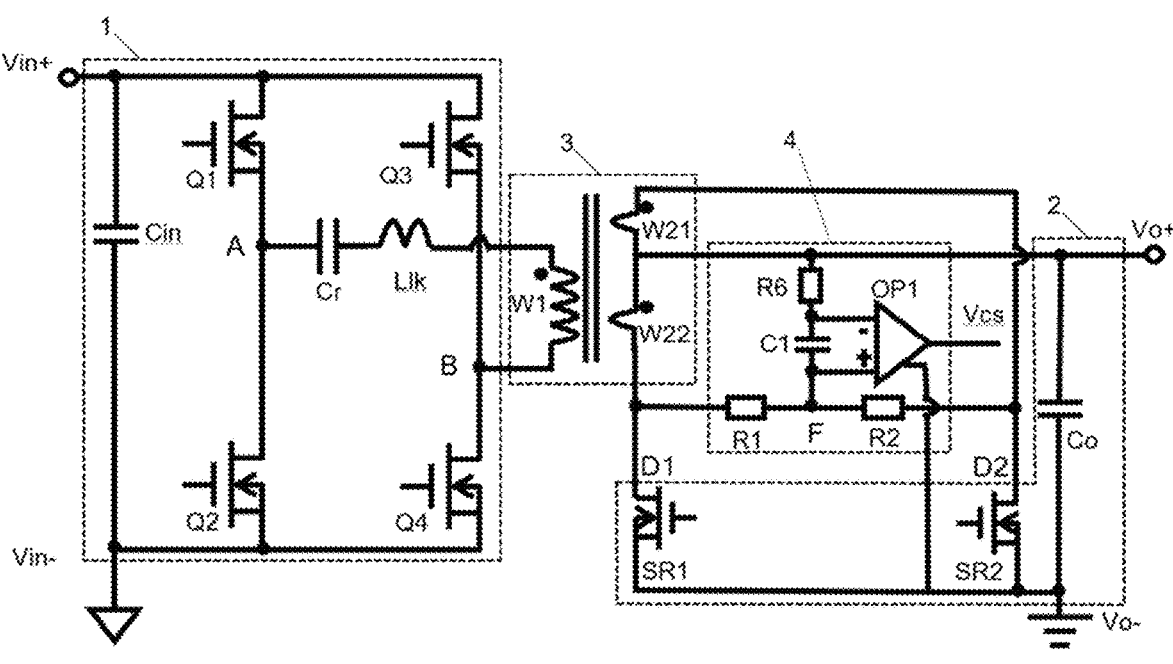
FIG. 9A to FIG. 9D are schematic diagrams of Embodiment 8.
Figure 9B:
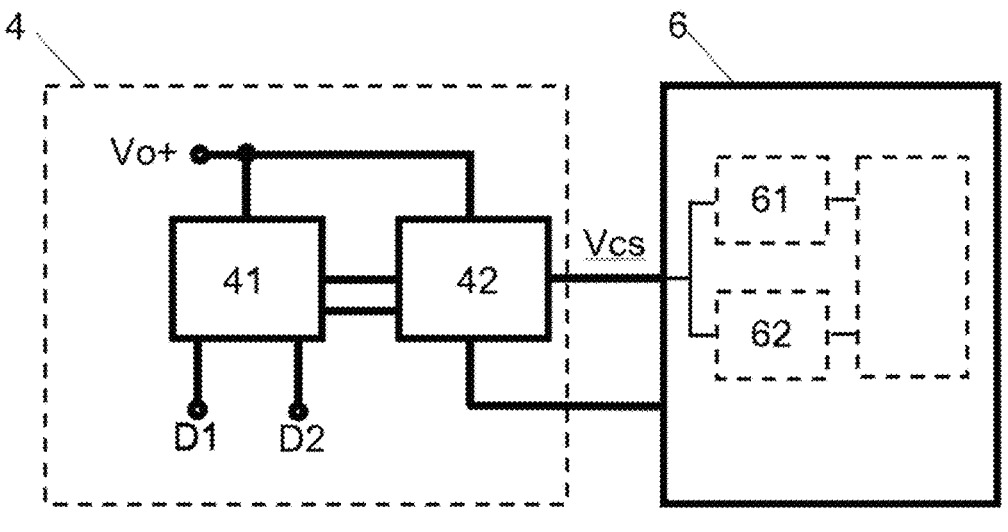

In the embodiment shown in FIG. 9A, the current sampling circuit 4 comprises two sampling resistors, the resistors sampling the currents flowing through the two synchronous rectification switches and a superposed-average current obtained. When the current sampling circuit 4 is implemented in the topology shown in FIG. 1A, it may be configured to sample the currents flowing through the switches SR1 and SR2, and the signals are sampled and averaged by superposing for expressing the output current of the overall topology. The sum of current flowing through the switch SR1 and current flowing through the SR2 is half of the output current of the overall topology, but in actual operations of the topology, the sum of current flowing through the switch SR1 and current flowing through the switch SR2 (i.e., the current of the first switching circuit) is not necessarily or always equal to the sum of current flowing through the switch SR3 and current flowing through the switch SR4 (i.e., the current of the second switching circuit), resulting in a problem of data distortion with the configuration of sampling signals merely in the first switching circuit for expressing the output current of the overall topology.

Figure 9C:
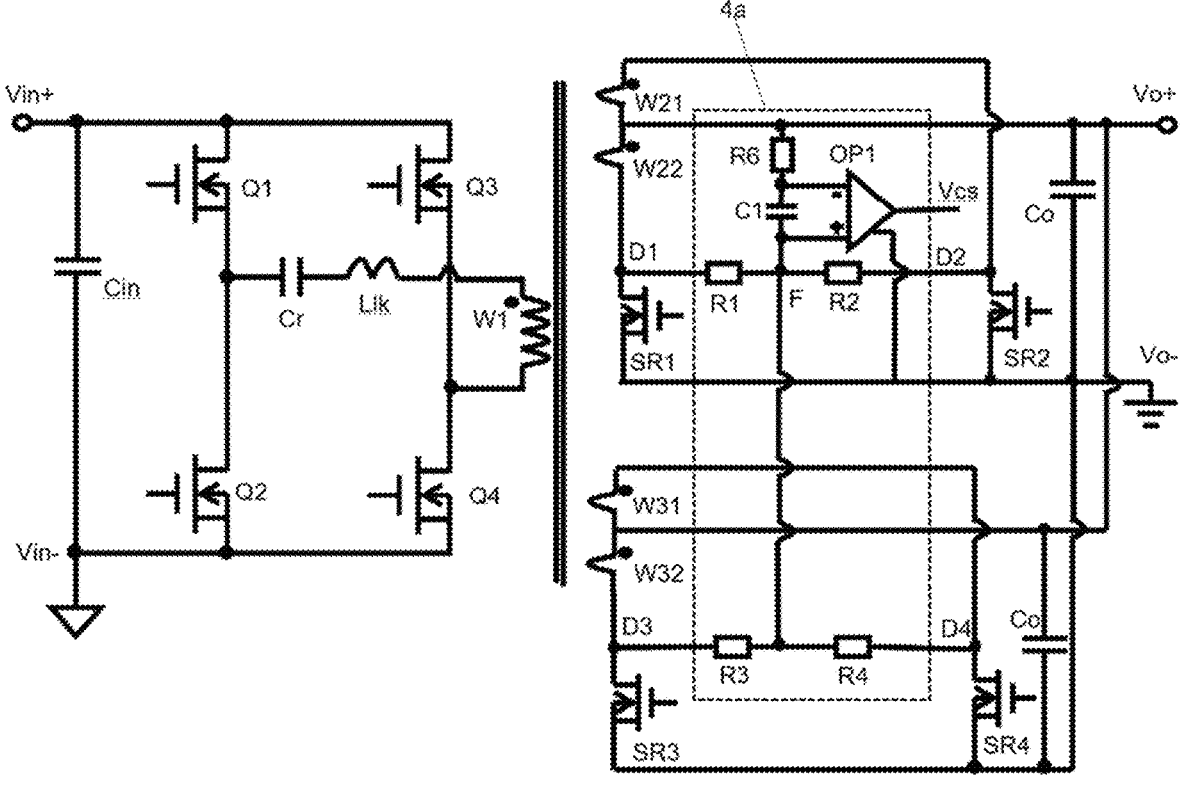

In order to avoid the data distortion, a current sampling circuit 4a is provided as shown in FIG. 9C, sampling and averaging by superposing not only the currents flowing through the switch SR1 and the switch SR2, but also the currents flowing through the switch SR3 and the switch SR4. Compared with the current sampling circuit 4 shown in FIG. 9A, the current sampling circuit 4a further comprises a sampling resistor R3 and a sampling resistor R4, one end of the sampling resistor R3 and one end of the sampling resistor R4 are electrically connected to the middle node F, and the other ends of the sampling resistors R3 and R4 are electrically connected with the drain D3 of the switch SR3 and the drain D4 of the switch SR4 respectively. The resistance of the four sampling resistors R1-R4 are the same, and the resistance of the impedance-matching resistor R6 is equal to the equivalent resistance of the four sampling resistors R1-R4 in parallel. The operating principle of the current detection circuit 4a is similar to the operating principle of the current detection circuit 4. The current sampling circuit 4a takes the output positive terminal Vo+ of the full-bridge LLC circuit topology as a reference, the voltage VD3 between the drain D3 of the switch SR3 and the sampling reference terminal and the voltage VD4 between the drain D4 of the switch SR4 and the sampling reference terminal are superposed and averaged to the sampling capacitor C1. The coupling voltage component across the low-voltage winding W32 and the coupling voltage component across the low-voltage winding W31 are equal in magnitude and opposite in direction. The two coupling voltage components are self-counteracted on the sampling capacitor C1. The current flowing through the switch SR3 and the current flowing through the switch SR4 are approximately equal in amplitude and 180 degrees out of phase. Therefore, the sampling resistor R3 and the sampling capacitor C1 do not need to filter the coupling voltage component across the low-voltage winding W32, the sampling resistor R4 and the sampling capacitor C1 do not need to filter the coupling voltage component across the low-voltage winding W31, and only two parasitic resistance voltage components superposed with a phase offset need to be filtered. Under any condition of operation, the voltage signal across the sampling capacitor C1 as well as the current sampling signal Vcs reflects the total amplitude of the output current of the full-bridge LLC circuit topology.

The current sampling circuits aforementioned may be implemented in Embodiment 1 to Embodiment 7 disclosed by the present application, but are not limited thereto, as long as two low-voltage windings with a switching circuit including two synchronous rectification switches as shown in the above embodiments are provided; the I/O voltages of the voltage terminals (i.e., the input terminals or the output terminals of the power conversion device) electrically connected with the current sampling circuit may be configured as not only direct-current voltages, but also superposed signals of alternating-current voltages and direct-current voltages. The frequency of the alternating-current voltage component is lower than 2000 Hz, and further in some embodiments, the frequency of the alternating-current voltage component is between 50 Hz and 60 Hz.

Figure 9D:
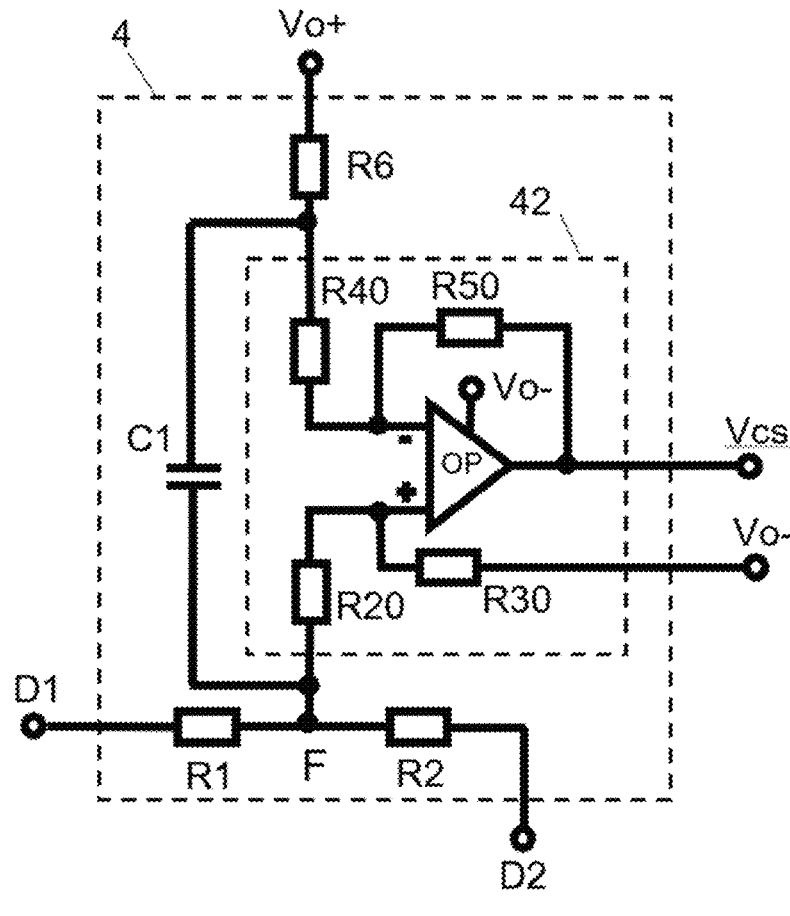

For further details, the circuit topology of the amplification unit 42 in the current sampling circuit 4 in some embodiments is as shown in FIG. 9D, and the amplification unit 42 comprises an operational amplifier OP, a second resistor R20, a third resistor R30, a fourth resistor R40 and a fifth resistor R50; the second resistor R20 is bridged between the positive input terminal of the operational amplifier OP and one end of the sampling capacitor C1, that is, the middle node F; the third resistor R30 is bridged between the positive input terminal of the operational amplifier OP and the reference ground of the operational amplifier OP, which is the output negative terminal Vo− (i.e., the second voltage terminal) of the power conversion device; the resistance of the resistors meet the equation of $R30/(R20+(R1\|R2))=R50/(R40+R6)$, wherein $R1\|R2$ represents an equivalent resistance of the sampling resistor R1 and the sampling resistor R2 in parallel, other parameters in the equation represent the resistances of the corresponding resistors, and R6 is equal to $R1\|R2$, as is described above. The structure of the amplification unit is not limited thereto, as long as it provides the function of proportional amplification.

In conclusion of the embodiment 8, with a symmetric winding arrangement and a phase-offset configuration of control signals in the power conversion device, coupling voltage components are self-counteracted, resulting the beneficial effects of the sampling circuit that the variation of the working current is effectively tracked with a reduced time constant. Thus, current reporting, current closed-loop control, current sharing control or over-current protection in the power conversion device may be simply and effectively carried out with the tracking of the working current by the sampling circuit.

Various embodiments in the present application are described above in a progressive manner, the description of each embodiment mainly focusing on the difference from other embodiments. The same or similar parts between embodiments may refer to each other for ease of understanding.

What is claimed is:

1. A current sampling circuit, comprising:

a sampling unit, wherein the sampling unit is provided with at least two sampling input terminals, a sampling reference terminal, and at least one sampling output terminal;

wherein the current sampling circuit is electrically connected with a power conversion device for detecting a working current; the power conversion device is provided with a first voltage terminal and a second voltage terminal; the power conversion device comprises at least one switching circuit and at least one winding group; each of the at least one winding group comprises two windings; the winding is provided with a first end and a second end; the second ends of the windings in one winding group are electrically connected with each other and with the first voltage terminal; the first ends of the windings in one winding group are electrically connected with the at least one switching circuit; a voltage waveform is provided across each winding changing according to a working frequency in operation; in each of the at least one winding group, the voltage waveforms corresponding to the two windings are in a phase offset of 180 degrees;

wherein the sampling reference terminal is directly connected to the first voltage terminal, and the at least two sampling input terminals are respectively directly connected to the first ends of the corresponding windings in a winding group or winding groups; and wherein the sampling unit is configured to sample voltage waveforms across the windings, averaging by superposing the voltage waveforms to obtain a first output signal, and outputting the first output signal through the at least one sampling output terminal; the first output signal is proportional to the working current of the power conversion device.

2. The current sampling circuit of claim 1, wherein M winding groups are provided in the power conversion device, and M is a positive integer; the voltage waveforms corresponding to one winding of each winding group are same in phase; output current components at nodes where the windings are electrically connected in the M winding groups are the same in phase; the working current of the power conversion device is equal to a superposition of the output current components at the nodes; and 2M sampling input terminals are provided.

3. The current sampling circuit of claim 1, wherein M winding groups are provided in the power conversion device, and M is a positive integer; the voltage waveforms corresponding to one winding of each winding group are in phase offsets of 360/(2M) degrees progressively in sequence; output current components of the windings are in phase offsets of 360/(2M) degrees progressively in sequence; and the working current is equal to a superposition of the output current components of the windings; 2M sampling input terminals are provided.

4. The current sampling circuit of claim 1, further comprising:

an amplification unit, wherein the amplification unit is provided with an amplification reference terminal, at least one amplification input terminal and an amplification output terminal; the amplification reference terminal is electrically connected with the second voltage terminal; the amplification input terminal is electrically connected with the sampling output terminal and configured for receiving the first output signal; the amplification unit is configured for amplifying the first output signal and outputting a second output signal, and the second output signal is proportional to the working current of the power conversion device.

5. The current sampling circuit of claim 1, wherein a proportional coefficient between the first output signal and the working current varies along with variation of a parasitic resistance of each winding.

6. The current sampling circuit of claim 1, wherein the sampling unit comprises at least two sampling resistors and a sampling capacitor, one end of each sampling resistor is electrically connected with one end of the sampling capacitor, another end of each sampling resistor is electrically connected to the corresponding sampling input terminal, and another end of the sampling capacitor is electrically connected to the sampling reference terminal, wherein coupling voltage components of the voltage waveforms are self-counteracted on the sampling capacitor while being averaged.

7. The current sampling circuit of claim 4, wherein the amplification unit comprises an operational amplifier, an input terminal of the operational amplifier is electrically connected to the amplification input terminal, and an output terminal of the operational amplifier is electrically connected to the amplification output terminal.

8. The current sampling circuit of claim 6, wherein the sampling unit further comprises an impedance-matching resistor; the sampling capacitor is electrically connected to the sampling reference terminal through the impedance-matching resistor; a resistance of the impedance matching resistor is greater than or equal to an equivalent resistance of the sampling resistors in parallel.

9. The current sampling circuit of claim 1, wherein the first and second voltage terminals are output terminals of the power conversion device, and the working current is output current of the power conversion device.

10. The current sampling circuit of claim 1, wherein the first and second voltage terminals are input terminals of the power conversion device, and the working current is input current of the power conversion device.

11. The current sampling circuit of claim 1, wherein the power conversion device is provided with a calibration unit; the current sampling circuit is electrically connected with the calibration unit; the calibration unit is configured for carrying out calibration processing and eliminating an influence on an amplitude distribution of output signals of the current sampling circuit by a value distribution of a parasitic resistance of the windings.

12. The current sampling circuit of claim 1, wherein the power conversion device is provided with a temperature compensation unit; the current sampling circuit is electrically connected with the temperature compensation unit; the temperature compensation unit is configured for compensating an influence of temperature on output signals of the current sampling circuit.

13. The current sampling circuit of claim 1, wherein a parasitic resistance of the windings is equal to each other.

14. The current sampling circuit of claim 1, wherein M winding groups are provided in the power conversion device, and M is a positive integer; the M winding groups are respectively wound around different magnetically permeable cores, or the M winding groups are respectively wound around different core legs of a same magnetically permeable core, or the M winding groups are wound on a same core leg of a same magnetically permeable core.

15. The current sampling circuit of claim 1, wherein each of the at least one switching circuit comprises two switches; one ends of the two switches in each of the at least one switching circuit are electrically connected with each other and with the second voltage terminal; the other ends of the two switches in each switching circuit are electrically connected with the first ends of the corresponding windings respectively; a duty ratio of control signals for the switches is 50%.

16. The current sampling circuit of claim 1, wherein the power conversion device is provided with at least one capacitor which is bridged between the first voltage terminal and the second voltage terminal; a terminal voltage across the first and second voltage terminals is a superposition of a direct-current voltage component and an alternating-current voltage component; a frequency of the alternating-current voltage component varies within a range that is smaller than 2000 Hz.

17. The current sampling circuit of claim 16, wherein the frequency of the alternating-current voltage component varies within a range between 50 Hz and 60 Hz.

* * * * *